United States Patent
Lee et al.

(10) Patent No.: US 8,119,022 B2
(45) Date of Patent: Feb. 21, 2012

(54) PIEZOELECTRIC SINGLE CRYSTAL AND METHOD OF PRODUCTION OF SAME, PIEZOELECTRIC ELEMENT, AND DIELECTRIC ELEMENT

(75) Inventors: Ho-Yong Lee, Kangnam-gu (KR);
Sung-Min Lee, Cheonan-si (KR);
Dong-Ho Kim, Seongdong-gu (KR)

(73) Assignee: Ceracomp Co., Ltd., Choongchungnam-Do (KR)

( * ) Notice: Subject to any disclaimer, the term of this patent is extended or adjusted under 35 U.S.C. 154(b) by 781 days.

(21) Appl. No.: 12/092,664

(22) PCT Filed: Nov. 6, 2006

(86) PCT No.: PCT/KR2006/004609
§ 371 (c)(1),
(2), (4) Date: May 5, 2008

(87) PCT Pub. No.: WO2007/052982
PCT Pub. Date: May 10, 2007

(65) Prior Publication Data
US 2008/0290315 A1    Nov. 27, 2008

(30) Foreign Application Priority Data
Nov. 4, 2005   (KR) .................. 10-2005-0105692

(51) Int. Cl.
*H01L 41/18*   (2006.01)
*H01L 41/00*   (2006.01)
*C04B 35/00*   (2006.01)
(52) U.S. Cl. ............. 252/62.9 R; 252/62.9 PZ; 310/358
(58) Field of Classification Search ............. 252/62.9 R, 252/62.9 PZ; 310/358, 359; 117/947, 949
See application file for complete search history.

(56) References Cited

U.S. PATENT DOCUMENTS
6,048,394 A * 4/2000 Harmer et al. ............... 117/8
(Continued)

FOREIGN PATENT DOCUMENTS
CN    1692184 A    11/2005
(Continued)

OTHER PUBLICATIONS

Seung-Eek Park, et al. "Ultrahigh strain and piezoelectric behaviro in relaxor based ferroelectric single crystals." Journal of the Applied Physics, vol. 82, No. 4, 1997. pp. 1804-1811.

(Continued)

*Primary Examiner* — Jerry Lorengo
*Assistant Examiner* — Lynne Edmondson
(74) *Attorney, Agent, or Firm* — Browdy and Neimark, PLLC

(57) ABSTRACT

A piezoelectric single crystal and piezoelectric and dielectric application parts using the same are provided, which have all of high dielectric constant $K_3^T$, high piezoelectric constants ($d_{33}$ and $k_{33}$), high phase transition temperatures (Tc and $T_{RT}$), high coercive electric field Ec and improved mechanical properties and thus can be used in high temperature ranges and high voltage conditions. Furthermore, the piezoelectric single crystals are produced by the solid-state single crystal growth adequate for mass production of single crystals and the single crystal composition is developed not to contain expensive raw materials so that the piezoelectric single crystals can be easily commercialized. With the piezoelectric single crystals and piezoelectric single crystal application parts, the piezoelectric and dielectric application parts using the piezoelectric single crystals of excellent properties can be produced and used in the wide temperature range.

36 Claims, 8 Drawing Sheets

U.S. PATENT DOCUMENTS

| | | | |
|---|---|---|---|
| 6,090,306 | A | 7/2000 | Tsubokura et al. |
| 6,321,779 | B1 | 11/2001 | Miller et al. |
| 6,685,849 | B2 * | 2/2004 | Eitel et al. ............... 252/62.9 R |
| 6,731,049 | B2 * | 5/2004 | Kashiwaya et al. .......... 310/358 |
| 6,758,898 | B2 * | 7/2004 | Lee et al. ......................... 117/3 |
| 6,900,579 | B2 | 5/2005 | Kanno et al. |
| 2004/0206296 | A1 * | 10/2004 | Lee et al. ......................... 117/2 |
| 2004/0222719 | A1 * | 11/2004 | Sasaki et al. .................. 310/358 |
| 2005/0140743 | A1 * | 6/2005 | Miyazawa et al. .............. 347/68 |
| 2006/0022604 | A1 * | 2/2006 | Takeuchi et al. ........... 315/169.3 |
| 2006/0091353 | A1 * | 5/2006 | Matsushita et al. ...... 252/62.9 R |
| 2006/0229187 | A1 * | 10/2006 | Liufu ............................ 501/134 |
| 2007/0034141 | A1 * | 2/2007 | Han ................................ 117/81 |

FOREIGN PATENT DOCUMENTS

| | | | |
|---|---|---|---|
| JP | H11-112048 | | 4/1999 |
| JP | 2001-102650 | | 4/2001 |
| JP | 2002-324924 | | 11/2002 |
| JP | 2003-267796 | | 9/2003 |
| JP | 2003267796 | A * | 9/2003 |
| JP | 2003-298133 | | 10/2003 |
| JP | 2005-150491 | | 6/2005 |
| JP | 2005-166912 | | 6/2005 |
| JP | 2005-530677 | | 10/2005 |
| JP | 2008-538825 | | 11/2008 |
| KR | 1020050105692 | A1 | 8/2005 |
| WO | 2004/033767 | A1 | 4/2004 |
| WO | 2005/033767 | | 4/2005 |
| WO | 2006/116240 | | 11/2006 |

OTHER PUBLICATIONS

Xiao-Hong Du, et al. "Crystal orientation dependence of piezoelectric properties of lead zirconate titanate near the morphotropic phase boundary." Applied Physics Letters, vol. 72, No. 19, 1998. pp. 2421-2423.

K. Yanagisawa, et al. "Stability and Single Crystal Growth of Dielectric Materials Containing Lead Under Hydrothermal Conditions." Journal of the European Ceramic Society, vol. 10, No. 19, 1999. pp. 1033-1036.

W. Chen, et al. "Pb(Zr1-xTix)O3 Single Crystals: Improved Growth and Characterization." Presented at the US Navy Workshop, 2004, State College, USA.

Seung-Eek Park, et al. "Characteristics of Relaxor-Based Piezoelectric Single Crystals for Ultrasonic Transducers." IEEE Transactions on Ultrasonics, Ferroelectrics, and Frequency Controls, vol. 44, No. 5, 1997. pp. 1140-1147.

Supplementary European Search Report in Appln No. 06812446.

Zhu and Meng "The influence of the morphotropic phase boundary on the dielectric and piezoelectric properties of the PNN-PZ-PT ternary system," Journal of Materials Science 31: 2171-2175 (1996).

Yoon and Lee "Electric-field-induced strain and piezoelectric properties near the morphotropic phase boundary of Pb(Mg1/3Nb2/3)O-sub-3-PbTiO-sub-3-PbZrO-sub-3 ceramics," J. Appl Physics 89(7): 3915-3919 (2001).

Office Action dated Jan. 27, 2011, issued by the State Intellectual Property Office of the People's Republic of China in Application No. 200680045393, 12 pages.

Office Action issued on Sep. 20, 2011, in counterpart Japanese Application No. 2008-538825, three pages.

\* cited by examiner

[Figure 1]
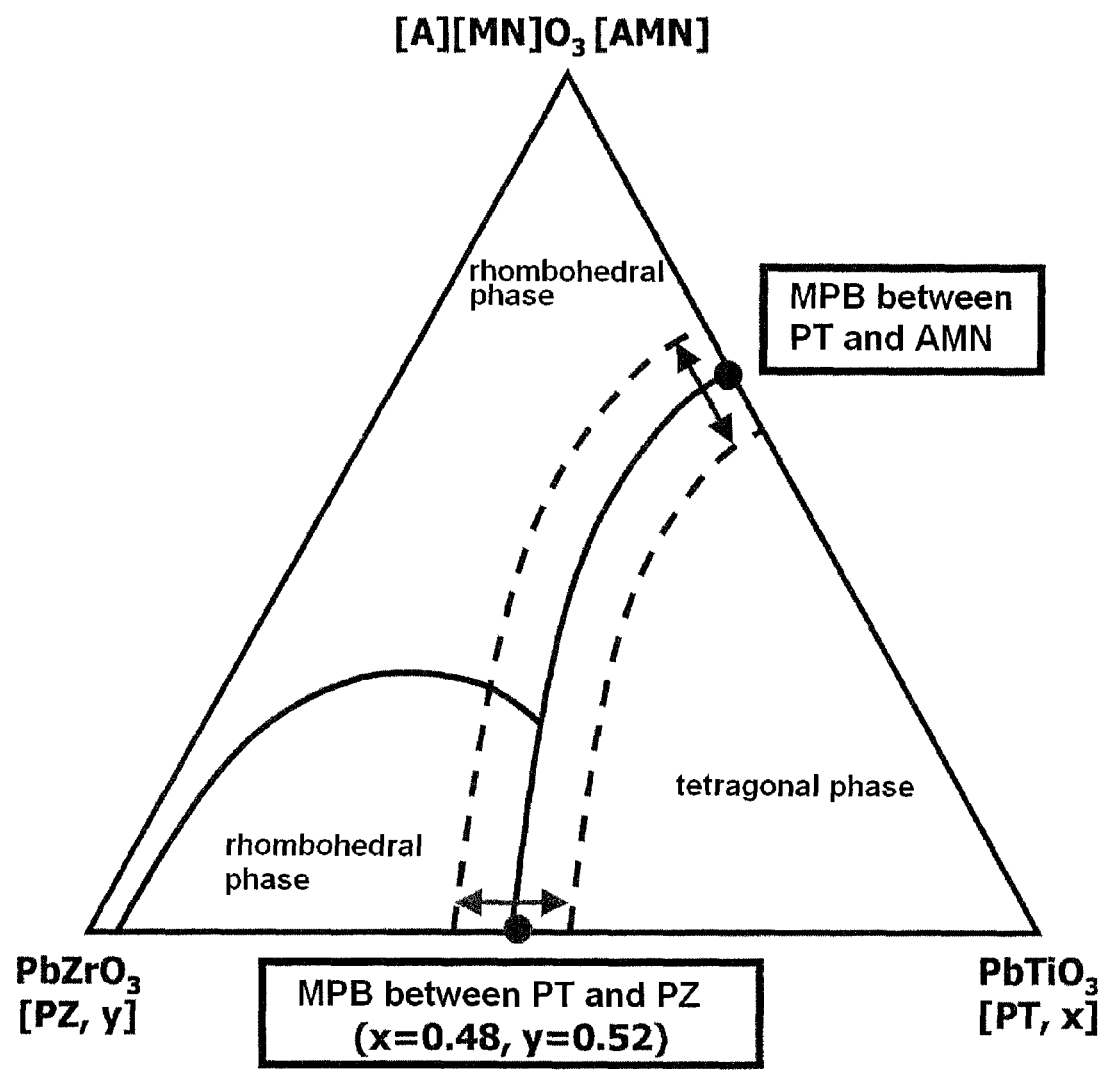

[Figure 2a]
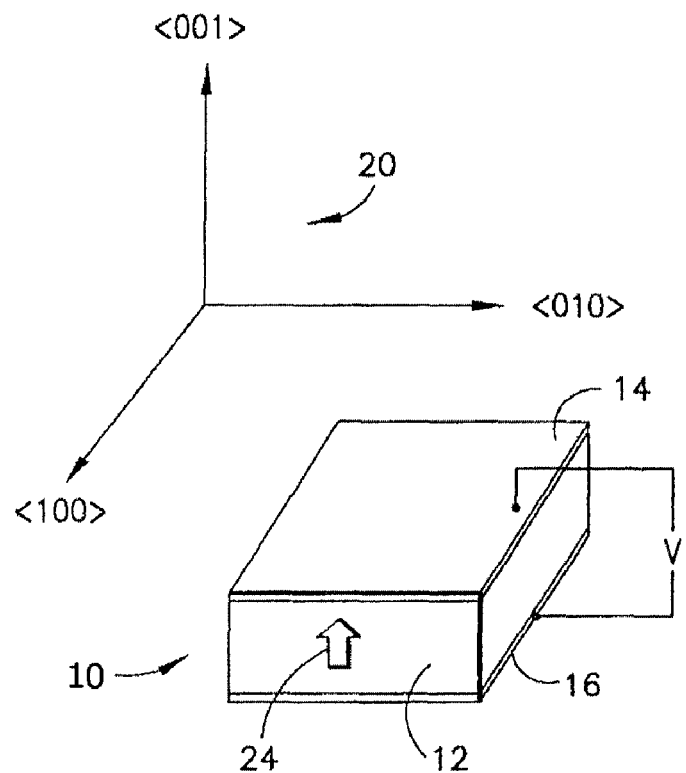
[Figure 2b]
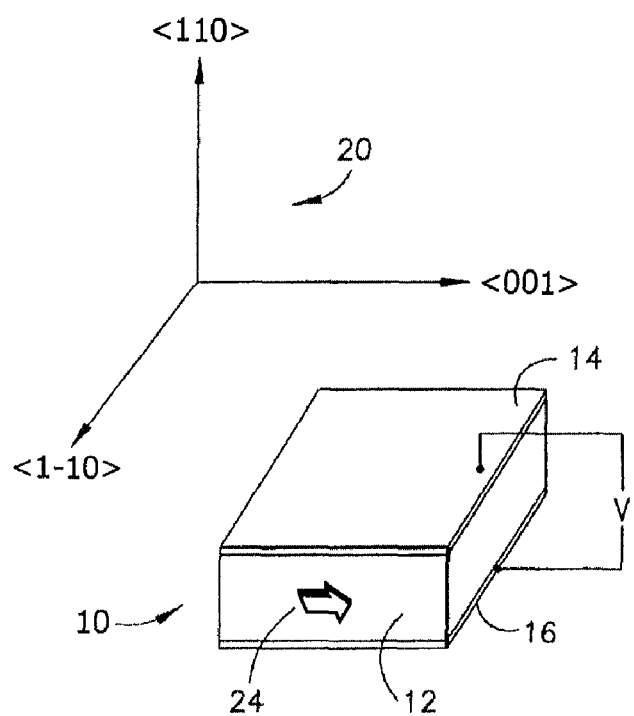

[Figure 3a]
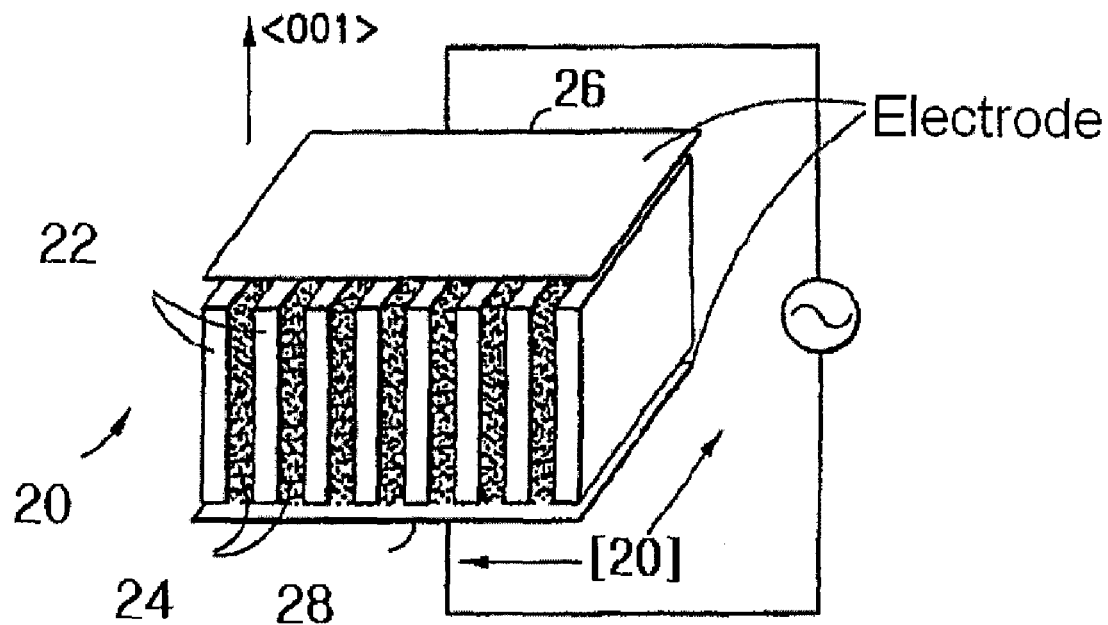
[Figure 3b]
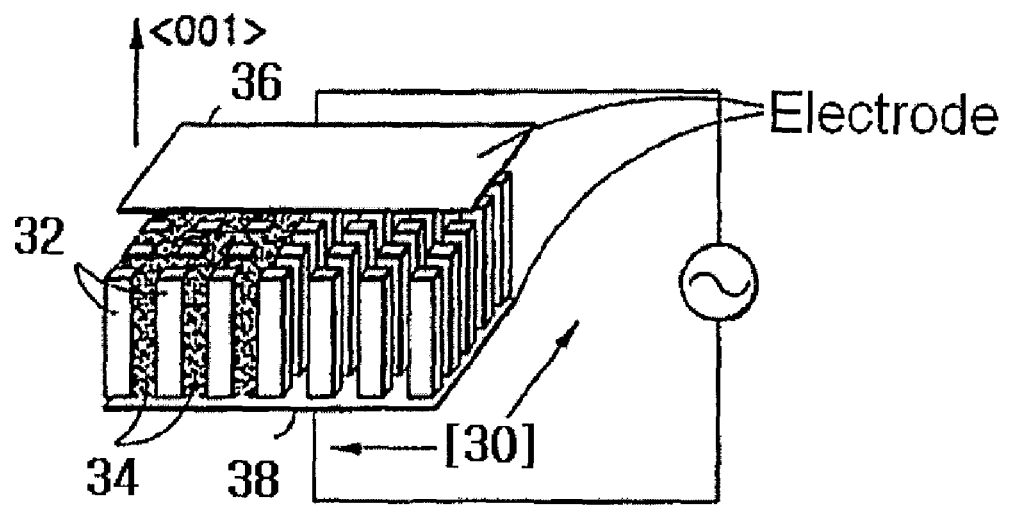

[Figure 4]
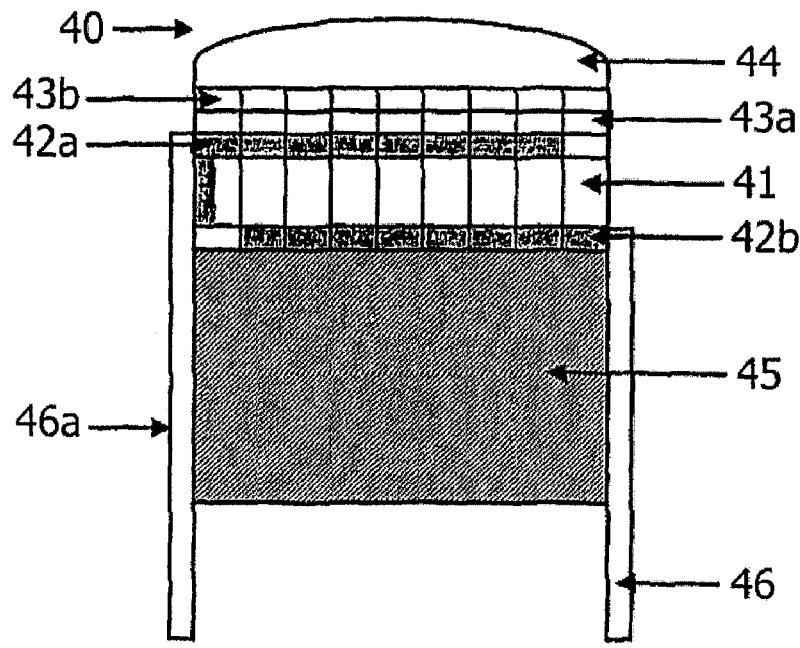
[Figure 5]
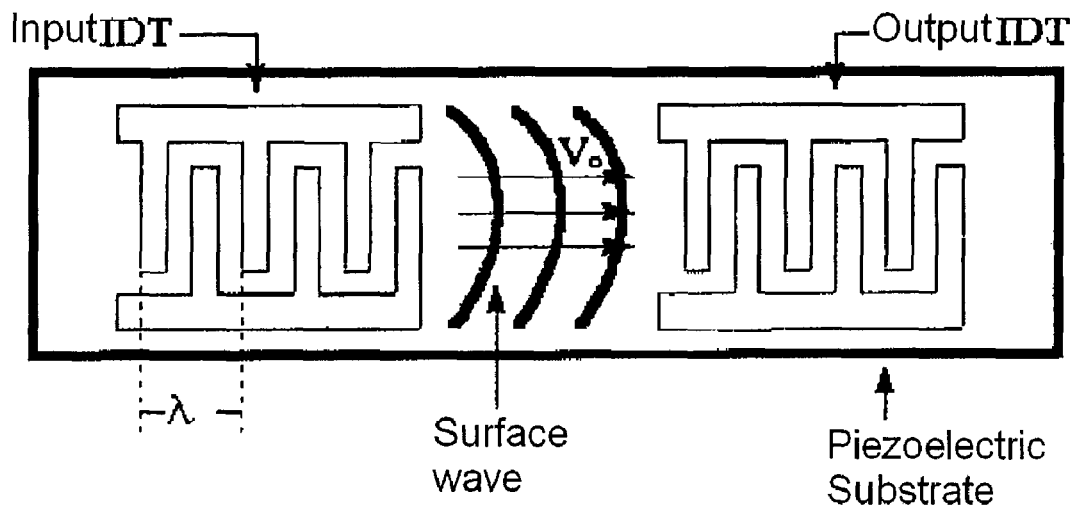

[Figure 6]
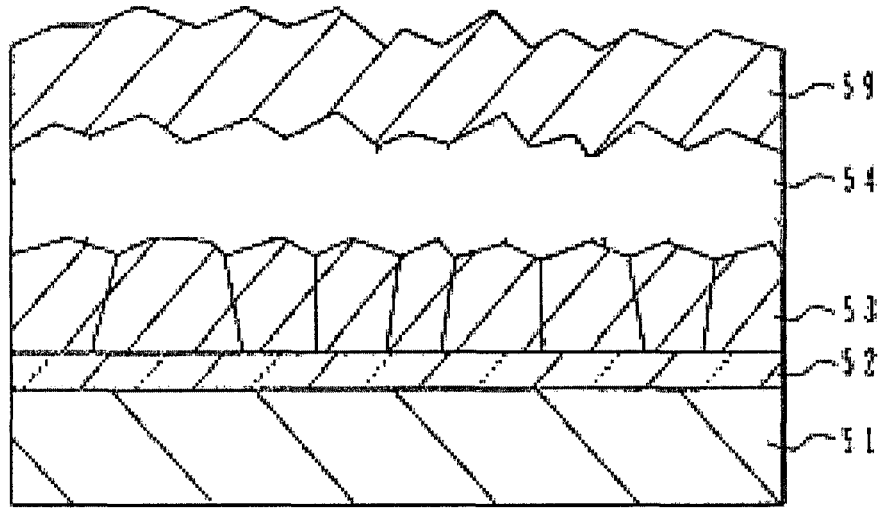
[Figure 7a]
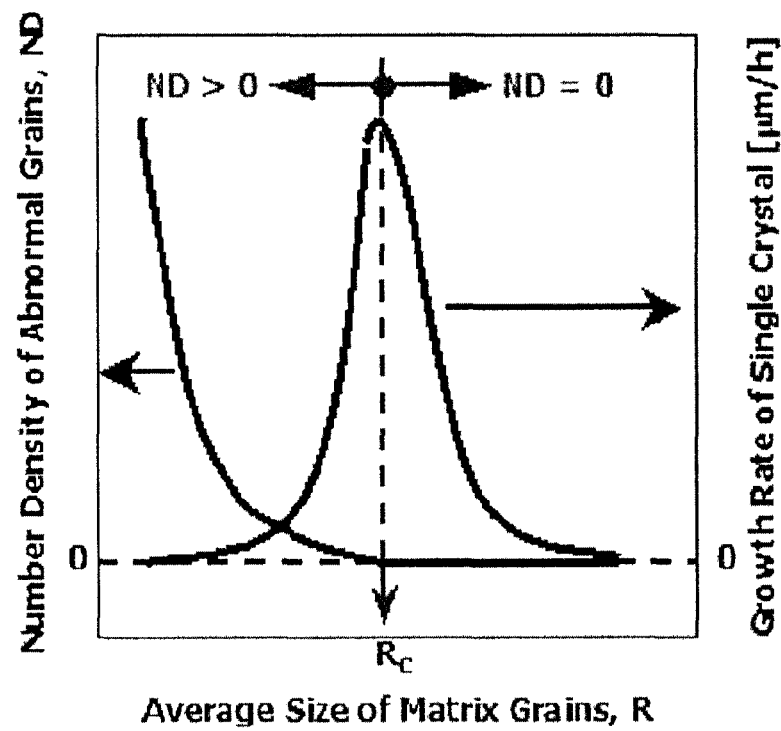
(Rc: Critical average size of matrix grains
for initiating abnormal grain growth
or ND=0

[Figure 7b]
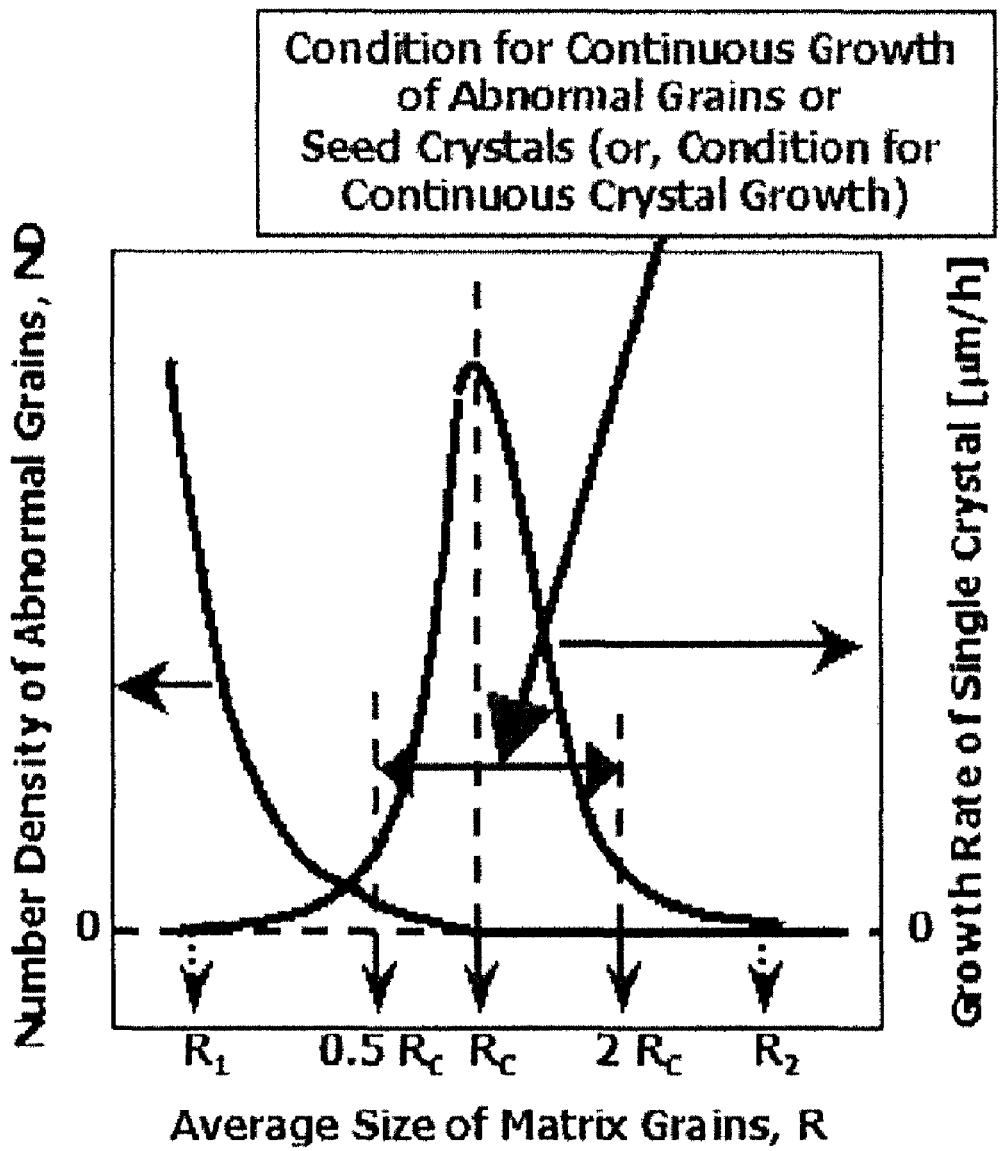

[Figure 8a]
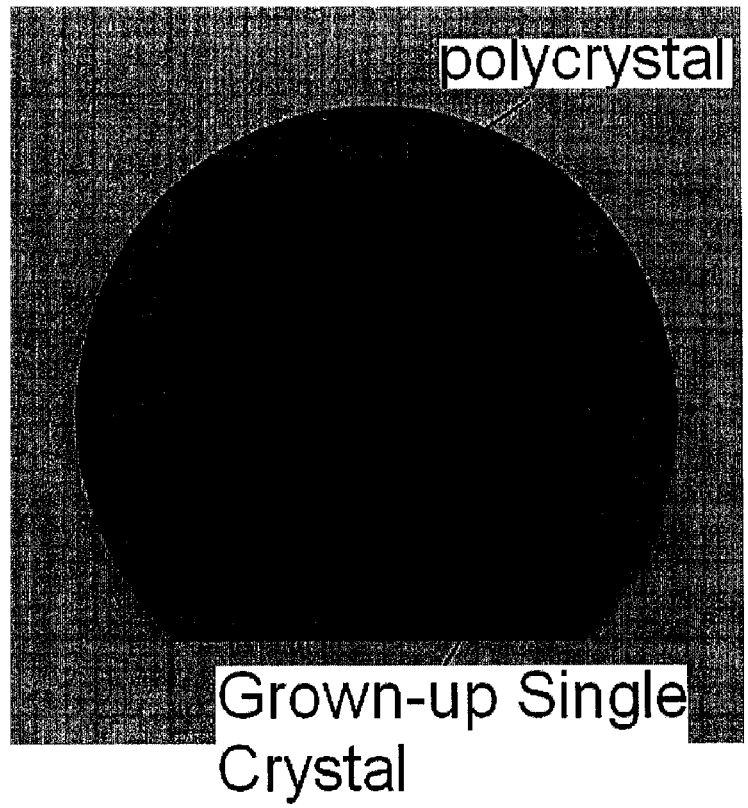
[Figure 8b]
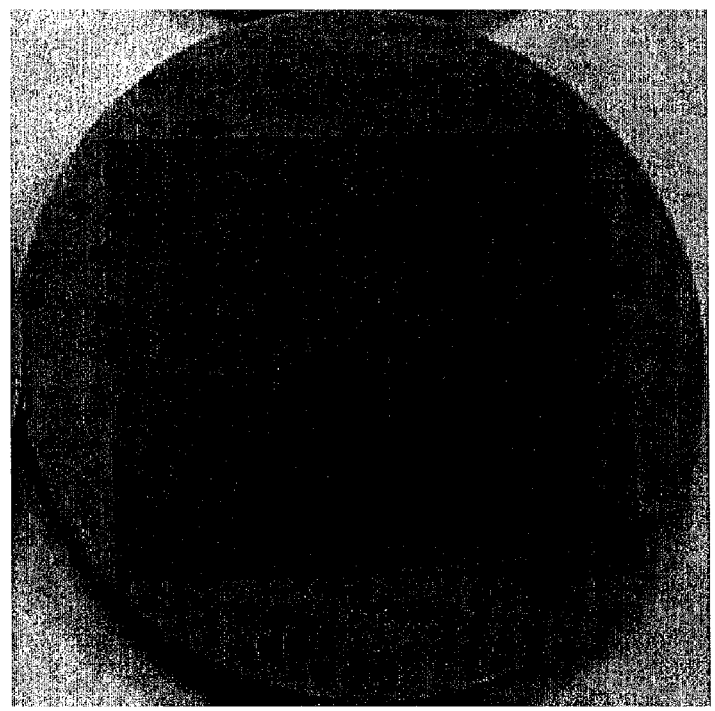

[Figure 9]
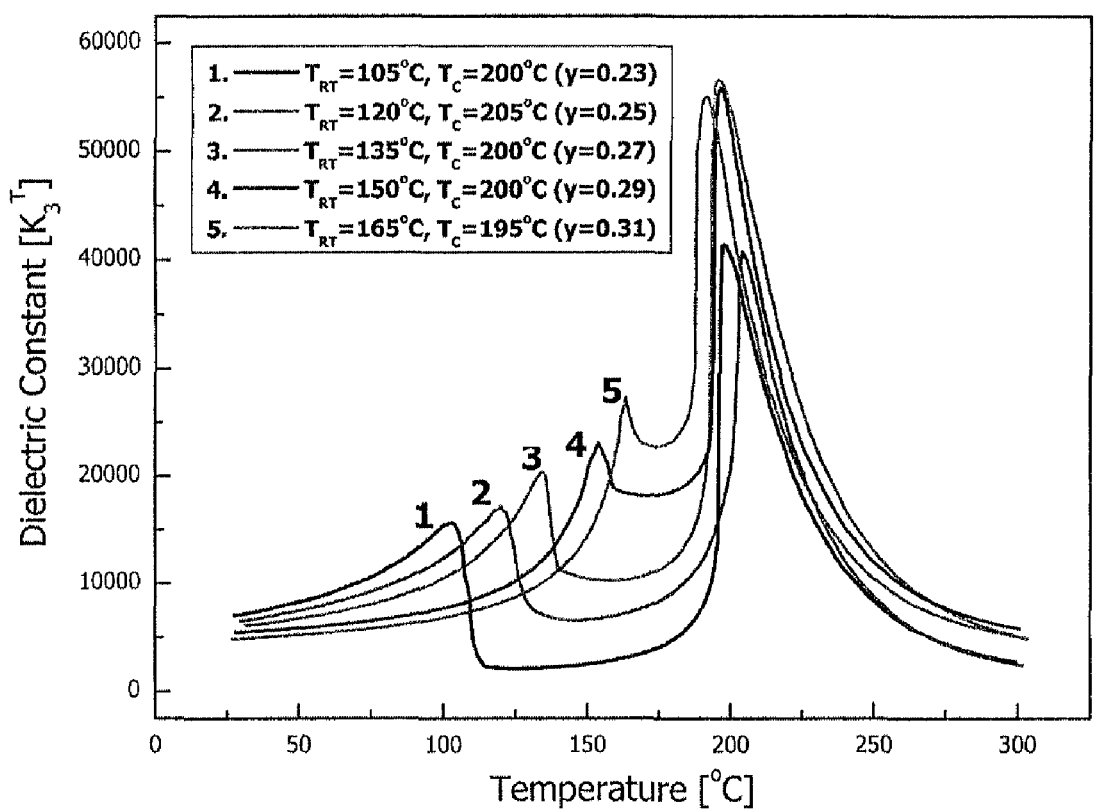

PIEZOELECTRIC SINGLE CRYSTAL AND METHOD OF PRODUCTION OF SAME, PIEZOELECTRIC ELEMENT, AND DIELECTRIC ELEMENT

TECHNICAL FIELD

The present invention relates to a piezoelectric single crystal, and piezoelectric and dielectric application parts using the same, and more particularly, to piezoelectric single crystals having a Perovskite-type crystal structure, which have high dielectric constant $K_3^T$, high piezoelectric constants ($d_{33}$ and $k_{33}$), high phase transition temperatures [Tc (Curie temperature or phase transition temperature between tetragonal and cubic phases) and $T_{RT}$ (phase transition temperature between rhombohedral and tetragonal phases)], high coercive electric field Ec and improved mechanical properties, and piezoelectric and dielectric application parts made of the same piezoelectric crystals.

BACKGROUND ART

Piezoelectric signal crystals having a Perovskite-type crystal structure have much higher dielectric constant ($K_3^T$) and piezoelectric constants ($d_{33}$ and $k_{33}$) than existing piezoelectric polycrystals, and are used in high performance parts, such as a piezoelectric actuator, a piezoelectric transducer, a piezoelectric sensor, and the like, so that they are expected to be adapted to substrate materials of various thin-film devices.

As the piezoelectric single crystals having a Perovskite-type crystal structure, which have been developed, there are PMN—PT ($Pb(Mg_{1/3}Nb_{2/3})O_3$—$PbTiO_3$), PZN—PT ($Pb(Zn_{1/3}Nb_{2/3})O_3$—$PbTiO_3$), PInN—PT ($Pb(In_{1/2}Nb_{1/2})O_3$—$PbTiO_3$), PYbN—PT ($Pb(Yb_{1/2}Nb_{1/2})O_3$—$PbTiO_3$), PSN—PT ($Pb(Sc_{1/2}Nb_{1/2})O_3$—$PbTiO_3$), PMN—PInN—PT, PMN—PYbN—PT, $BiScO_3$—$PbTiO_3$ (BS—PT), and others. These single crystals exhibited congruent melting upon melting, and were generally prepared by a flux method, a Bridgman method, and others, which are the existing single crystal growth methods.

The piezoelectric single crystals, which had been developed, such as PMN—PT, PZN—PT, and the like, have an advantage of showing high dielectric and piezoelectric characteristics at room temperature ($K_3^T$>4,000), $d_{33}$>1,400 pC/N and $k_{33}$>0.85), but also have defects of having low phase transition temperatures (Tc and $T_{RT}$), low coercive field (Ec), brittleness, and the like, so that conditions such as usable temperature range, usable voltage, or the like of the piezoelectric single crystals, and fabrication conditions of piezoelectric single crystal application parts come to be greatly limited. Generally, it has been known that Perovskite-type piezoelectric single crystals have the highest dielectric and piezoelectric characteristics at a phase boundary between a rhombohedral phase and a tetragonal phase, i.e., around a morphotropic phase boundary (MPB) composition. Tetragonal piezoelectric single crystals have been known to be usable in some of specified crystalline orientations having excellent piezoelectric or electrooptical properties.

However, since the Perovskite-type piezoelectric single crystals in general show the best excellent dielectric and piezoelectric characteristics when they are rhombohedral phases, rhombohedral piezoelectric single crystals are widely applied. However, since the rhombohedral piezoelectric single crystals are stable only below a phase transition temperature ($T_{RT}$) between a rhombohedral phase and a tetragonal phase, they are usable only below $T_{RT}$ that is the highest temperature at which the rhombohedral phase can be stable.

Thus, when the phase transition temperature ($T_{RT}$) is low, the usable temperature of the rhombohedral piezoelectric single crystal comes to low, and the fabrication and use temperatures of the piezoelectric single crystal application parts are restricted below $T_{RT}$. In addition, when the phase transition temperatures (Tc and $T_{RT}$) and coercive field (Ec) are low, under mechanical machining, strains, heat generation, and driving voltages, the piezoelectric single crystals are easily depoled, and excellent dielectric and piezoelectric characteristics thereof are lost.

Accordingly, piezoelectric single crystals having low phase transition temperatures (Tc and $T_{RT}$) and coercive field (Ec) are restricted in conditions on fabrication of application parts thereof, usable temperatures, driving voltages, and the like. In the case of PMN—PT single crystal, in general, it is in the state of Tc<150° C., $T_{RT}$<80° C., and Ec<2.5 kV/cm. In the case of PZT—PT single crystal, in general, it is in the state of Tc<170° C., $T_{RT}$<100° C., and Ec<3.5 kV/cm.

Moreover, dielectric and piezoelectric application parts fabricated by using such piezoelectric single crystals are also restricted in their conditions on fabrication, usable temperature ranges, usable voltages, or the like, so that it is difficult to develop and realize the piezoelectric single crystal application parts.

In order to overcome disadvantages of the piezoelectric single crystals, there has been developed a single crystal having a new composition, such as PInN—PT, PSN—PT, BS—PT, and the like, and there also has been studied combination-type compositions of the single crystal, such as PMN—PInN—PT, PMN—BS—PT, and the like. In the case of these single crystals, however, dielectric constant, piezoelectric constant, phase transition temperatures, coercive field, and mechanical characteristics thereof cannot be totally improved. Further, the piezoelectric single crystals essentially composed of Sc, In, and the like, which are expensive, are under a difficulty in putting to practical use due to their high production cost.

The reason why the presently developed Perovskite-type piezoelectric single crystals have low phase transition temperatures may be divided into following three cases. First, as shown in Table 1, the reason is because a phase transition temperature of a relaxer (such as PMN, PZN, or the like), which may be an essential element, together with PT, is low. Table 1 shows phase transition temperatures (Curie Temperatures, Tc) between tetragonal phases and cubic phases of Perovskite piezoelectric ceramic polycrystals (Ref.: Park et al., "Characteristics of Relaxor-Based Piezoelectric Single Crystals for Ultrasonic Transducers," IEEE Transactions on Ultrasonics, Ferroelectrics, and Frequency Control, vol. 44, no. 5, 1997, pp. 1140-1147). Since the Curie temperature of the piezoelectric single crystal is similar to that of the polycrystal having the same composition, it can be estimated the Curie temperature of the piezoelectric single crystal from that of the polycrystal. Second, the reason is because MPB forming a boundary between a rhombohedral phase and a tetragonal phase does not become perpendicular to a temperature axis, and is gently inclined. Thus, since the Curie temperature (Tc) is essentially reduced in order to raise the phase transition temperatures ($T_{RT}$), it is difficult to raise the Tc, together with the $T_{RT}$. Third, the reason is because, also in the case where the relaxer (PYbN, PInN, $BiScO_3$, or the like) having relatively high Tc is mixed with PMN—PT and the like, there is a problem in that the phase transition temperature does not simply increase in proportion to the composition, or dielectric and piezoelectric characteristics are degraded.

TABLE 1

| Binary systems (Relaxor-PT) (Tc of PbTiO$_3$) = 490° C.) | PT content on MPB | Tc [° C.] of MPB | Tc [° C.] of end component |
|---|---|---|---|
| (1−x)Pb(Zn$_{1/3}$Nb$_{2/3}$)O$_3$—xPbTiO$_3$ (PZN-PT) | x ≈ 0.09 | ~180 | 140 |
| (1−x)Pb(Mg$_{1/3}$Nb$_{2/3}$)O$_3$—xPbTiO$_3$ (PMN-PT) | x ≈ 0.33 | ~150 | −10 |
| (1−x)Pb(Mg$_{1/3}$Ta$_{2/3}$)O$_3$—xPbTiO$_3$ (PMT-PT) | x ≈ 0.38 | ~80 | −98 |
| (1−x)Pb(Ni$_{1/3}$Nb$_{2/3}$)O$_3$—xPbTiO$_3$ (PNN-PT) | x ≈ 0.40 | ~170 | −120 |
| (1−x)Pb(Co$_{1/3}$Nb$_{2/3}$)O$_3$—xPbTiO$_3$ (PCoN-PT) | x ≈ 0.38 | ~250 | −98 |
| (1−x)Pb(Sc$_{1/2}$Ta$_{1/2}$)O$_3$—xPbTiO$_3$ (PST-PT) | x ≈ 0.45 | ~205 | 26 |
| (1−x)Pb(Sc$_{1/2}$Nb$_{1/2}$)O$_3$—xPbTiO$_3$ (PSN-PT) | x ≈ 0.43 | ~250 | 90 |
| (1−x)Pb(Fe$_{1/2}$Nb$_{1/2}$)O$_3$—xPbTiO$_3$ (PFN-PT) | x ≈ 0.07 | ~140 | 110 |
| (1−x)Pb(Yb$_{1/2}$Nb$_{1/2}$)O$_3$—xPbTiO$_3$ (PYbN-PT) | x ≈ 0.50 | ~360 | 280 |
| (1−x)Pb(In$_{1/2}$Nb$_{1/2}$)O$_3$—xPbTiO$_3$ (PIN-PT) | x ≈ 0.37 | ~320 | 90 |
| (1−x)Pb(Mg$_{1/2}$W$_{1/2}$)O$_3$—xPbTiO$_3$ (PMW-PT) | x ≈ 0.55 | ~60 | 39 |
| (1−x)Pb(Co$_{1/2}$W$_{1/2}$)O$_3$—xPbTiO$_3$ (PCoW-PT) | x ≈ 0.45 | ~310 | 32 |
| (1−x)PbZrO$_3$—xPbTiO$_3$ (PZT) | x ≈ 0.48 | ~360 | 230 |

Relaxer-PT based single crystals of Table 1 are prepared by flux method or Bridgman method, which is existing single crystal growth method generally using a melting process. However, such single crystals were not yet put to practical use because of difficulty in producing a large single crystal having uniform composition, high production cost, and difficulty in mass production.

Generally, the piezoelectric single crystals have lower mechanical strength and fracture toughness relative to the piezoelectric polycrystalline ceramics, to thereby have a defect of being easily broken by even low mechanical impact. Brittleness of the piezoelectric single crystals causes easy breakage of the piezoelectric single crystals during fabrication and use of the piezoelectric single crystal application parts, which greatly restricts the use of piezoelectric single crystals. Accordingly, there is a need to improve mechanical properties of the piezoelectric single crystals, together with dielectric and piezoelectric characteristics thereof, in order for commercialization of the piezoelectric single crystals.

Disclosure
Technical Problem

The present invention provides piezoelectric single crystals having a Perovskite-type crystal structure, in particular, which have a high dielectric constant ($K_3^T \geq 4,000$ to 8,000), high piezoelectric constants ($d_{33} \geq 1,400$ pC/N to 2,500 pC/N and $k_{33} \geq 0.85$ to 0.95), high phase transition temperatures (Tc$\geq$180° C. to 400° C. and $T_{RT} \geq$100° C. to 250° C.), a high coercive field (Ec$\geq$5 kV/cm to 15 kV/cm) and improved mechanical properties.

Unlike the existing Perovskite-type piezoelectric single crystals containing expensive elements such as Sc and In as the major component, the invention introduces a novel composition of Perovskite-type piezoelectric single crystals, which never or rarely contain expensive elements but have excellent characteristics, to lower single crystal production costs, thereby enabling commercialization of the piezoelectric single crystals.

Furthermore, the invention provides dielectric and piezoelectric application parts including Perovskite-type piezoelectric single crystals having all of high dielectric constant ($K_3^T$), high piezoelectric constants ($d_{33}$ and $k_{33}$), high phase transition temperatures (Tc and $T_{RT}$) and high coercive field (Ec) so that the dielectric and piezoelectric application parts using the piezoelectric single crystals of excellent characteristics can be produced and used in high temperature ranges. The invention also provides a method of growing single crystals which is different from existing single crystal growth methods such as flux and Bridgman methods, and can employ a solid-state crystal growth method in order to mass produce single crystals at low cost according to a general heat-treatment process without having to use specific apparatuses.

Furthermore, the invention provides piezoelectric single crystals having a Perovskite structure which are highly resistant against mechanical impact but have good machinability. Accordingly, the application parts can be fabricated easily by using the piezoelectric single crystals so that the fracture or deterioration of the application parts in use can be prevented.

Technical Solution

To obtain the foregoing objects, a piezoelectric single crystal having a Perovskite-type crystal structure ([A][B]O$_3$) of the invention contains Zr.

The piezoelectric single crystal has a composition expressed by formula 1 below:

$$[A][(MN)_{(1-x-y)}Ti_xZr_y]O_3 \qquad \text{[Formula 1]}$$

wherein A is at least one selected from the group consisting of Pb, Sr, Ba and Bi, M is at least one selected from the group consisting of Ce, Co, Fe, In, Mg, Mn, Ni, Sc, Yb and Zn, N is one selected from the group consisting of Nb, Sb, Ta and W, and x and y satisfy, by mole fraction, following relationships:

$$0.05 \leq x \leq 0.58, \text{ and}$$

$$0.05 \leq y \leq 0.62.$$

In formula 1 above, A is preferably Pb. That is, the composition is preferably expressed by formula 2:

$$[Pb][(MN)_{(1-x-y)}Ti_xZr_y]O_3 \qquad \text{[Formula 2]}$$

In formula 1 above, N is preferably Nb. That is, the composition is expressed by formula 3:

$$[A][((M)(Nb))_{(1-x-y)}Ti_xZr_y]O_3 \qquad \text{[Formula 3]}$$

The piezoelectric single crystal having the composition of formula 1 preferably has a composition expressed by formula 4:

$$[Pb_{(1-a-b)}Sr_aBa_b][((Mg,Zn)_{1/3}Nb_{2/3})_{(1-x-y)}Ti_xZr_y]O_3 \qquad \text{[Formula 4]}$$

where a and b satisfy following relationships: by mole fraction, $0.0 \leq a \leq 0.1$, and, $0.0 \leq b \leq 0.6$.

The piezoelectric single crystal having the composition of formula 1 preferably has a composition expressed by formula 5:

$$[Pb][((Mg_{(1-a)}Zn_a)_{1/3}Nb_{2/3})_{(1-x-y)}Ti_xZr_y]O_3 \qquad \text{[Formula 5]}$$

where x and a satisfy following relationships: by mole fraction, $0.20 \leq x \leq 0.58$, and $0.0 \leq a \leq 0.5$.

The piezoelectric single crystal having the composition of formula 1 preferably has a composition expressed by formula 6:

$$[Pb][(Mg_{1/3}Nb_{2/3})_{(1-x-y)}Ti_xZr_y]O_3 \qquad \text{[Formula 6]}$$

where x satisfies a following relationship: by mole fraction, $0.25 \leq x \leq 0.58$.

The piezoelectric single crystal having the composition of formula 1 preferably has a composition expressed by formula 7:

$$[Ba_xBi_{(1-x)}][Fe_{(1-x)}Ti_{(x-y)}Zr_y]O_3 \quad \text{[Formula 7]}$$

where x and y satisfy following relationships: by mole fraction, $0.65 \leq x \leq 1.00$ and $0.05 \leq y \leq 0.15$.

Furthermore, the piezoelectric single crystal preferably has a composition wherein P is added to any one of the compositions of formulas 1 to 7. Particularly, the piezoelectric single crystal preferably has a composition according to any one of formulas 8 to 14 below. P exists in the form of second phase in the piezoelectric single crystal, and preferably, a second phase of one selected from the group consisting of metals, oxides and pores. Furthermore, P is at least one selected from the group consisting of metals [Au (Gold), Ag (Silver), Ir (Iridium), Pt (Platinum), Pd (Palladium), Rh (Rhodium)], oxides [MgO and $ZrO_2$] and pores. P added is preferably in the range from 0.1% to 20% by volume fraction with respect to the whole composition.

$$[A][(MN)_{(1-x-y)}Ti_xZr_y]O_3 + cP \quad \text{[Formula 8]}$$

In formula 8, A is at least one selected from the group consisting of Pb, Sr, Ba and Bi, M is at least one selected from the group consisting of Ce, Co, Fe, In, Mg, Mn, Ni, Sc, Yb and Zn, and N is one selected from the group consisting of Nb, Sb, Ta and W. In addition, P exists in the form of second phase in the piezoelectric single crystal, and preferably, a second phase of one selected from the group consisting of metals (Au, Ag, Ir, Pt, Pd and Rh), oxides (MgO and $ZrO_2$) and pores. Furthermore, c satisfies, by volume fraction, the following relationship: $0.001 \leq c \leq 0.20$, and x and y satisfy, by mole fraction, following relationships:

$$0.05 \leq x \leq 0.58.$$

$$0.05 \leq y \leq 0.62$$

$$[Pb][(MN)_{(1-x-y)}Ti_xZr_y]O_3 + cP \quad \text{[Formula 9]}$$

In formula 9 above, M, N, x, y, P and c are equal as defined in formula 8 above.

$$[A][((M)(Nb))_{(1-x-y)}Ti_xZr_y]O_3 + cP \quad \text{[Formula 10]}$$

In formula 10 above, A, M, x, y, P and c are equal as defined in formula 8 above.

$$[Pb_{(1-a-b)}Sr_aBa_b][((Mg,Zn)_{1/3}Nb_{2/3})_{(1-x-y)}Ti_xZr_y]O_3 + cP \quad \text{[Formula 11]}$$

In formula 11 above, x, y, P and c are equal as defined in formula 8 above, a satisfies, by mole fraction, a relationship: $0.0 \leq a \leq 0.1$, and b satisfies, by mole fraction, a relationship: $0.0 \leq b \leq 0.6$.

$$[Pb][((Mg_{(1-a)}Zn_a)_{1/3}Nb_{2/3})_{(1-x-y)}Ti_xZr_y]O_3 + cP \quad \text{[Formula 12]}$$

In formula 12 above, y, P and c are equal as defined in formula 8 above, x satisfies, by mole fraction, a relationship: $0.20 \leq x \leq 0.58$, and a satisfies, by mole fraction, a relationship: $0.0 \leq a \leq 0.5$.

$$[Pb][(Mg_{1/3}Nb_{2/3})_{(1-x-y)}Ti_xZr_y]O_3 + cP \quad \text{[Formula 13]}$$

In formula 13 above, y, P and c are equal as defined in formula 8 above, and x satisfies, by mole fraction, a relationship: $0.25 \leq x \leq 0.58$.

$$[Ba_xBi_{(1-x)}][Fe_{(1-x)}Ti_{(x-y)}Zr_y]O_3 + cP \quad \text{[Formula 14]}$$

In formula 14 above, P and c are equal as defined in formula 8 above, x and y satisfy, by mole fraction, relationships: $0.65 \leq x \leq 1.00$ and $0.05 \leq y \leq 0.15$.

The piezoelectric single crystals having any one of the compositions according to formulas 1 to 14 show all of the following properties: dielectric constant of $K_3^T > 4,000$; piezoelectric constant of $d_{33} \geq 1,400$ pC/N and $k_{33} \geq 0.85$; phase transition temperatures of $Tc \geq 180°$ C. and $T_{RT} \geq 100°$ C. and coercive field of $Ec \geq 5$ kV/cm.

The invention also relates to dielectric and piezoelectric application parts which include piezoelectric single crystals having a Perovskite crystal structure expressed by any one of formulas above and thus show all of the following properties: dielectric constant of $K_3^T \geq 4,000$; piezoelectric constant of $d_{33} \geq 1,400$ pC/N and $k_{33} \geq 0.85$; phase transition temperatures of $Tc \geq 180°$ C. and $T_{RT} \geq 100°$ C. and coercive field of $Ec \geq 5$ kV/cm.

The invention also relates to dielectric and piezoelectric application parts which include lead-free piezoelectric single crystals having a lead-free Perovskite crystal structure expressed by any one of formulas above and thus are environmental friendly free from toxic lead (Pb).

Furthermore, the piezoelectric single crystals having the composition according to any one of formulas 8 to 14 contain at least one reinforcing second phase (P) selected from the group consisting of metals (Au, Ag, Ir, Pt, Pd and Rh), oxides (MgO and $ZrO_2$) and pores. With improved mechanical properties, the piezoelectric single crystals provide large resistance against mechanical impact but good machinability. In particular, in case of the second phase of metals (Au, Ag, Ir, Pt, Pd and Rh), dielectric and piezoelectric characteristics are also improved.

Furthermore, the piezoelectric single crystals having the composition according to any one of formulas 8 to 14 contain at least one reinforcing second phase (P) selected from the group consisting of metals (Au, Ag, Ir, Pt, Pd and Rh), oxides (MgO and $ZrO_2$) and pores, in which the reinforcing second phase (P) is uniformly distributed in form of particles or regularly distributed in a specific pattern in the piezoelectric single crystal. According to the distribution type of the reinforcing second phase, dielectric, piezoelectric and mechanical properties of the piezoelectric single crystals are improved.

The invention also provides a method of producing piezoelectric single crystals having a composition expressed by any one of formulas above. The method of producing piezoelectric single crystals includes: (a) controlling average size of matrix grains of a polycrystal having said composition to reduce number density (ND) of abnormal grains; and (b) heat-treating said polycrystal with the number density of abnormal grains reduced through the step (a) to grow the abnormal grains.

Furthermore, the method of producing piezoelectric single crystals includes: (a) controlling the composition, heat-treatment temperature and heat-treatment atmosphere to promote abnormal grain growth in a polycrystal and controlling average size of matrix grains of the polycrystal to reduce number density (ND) of abnormal grains; and (b) heat-treating said polycrystal with the number density of abnormal grains reduced through the step (a) to grow the abnormal grains. In this fashion, it is possible to continuously grow only the reduced number of abnormal grains free from interference from surrounding abnormal grains or continuously grow the single crystal seed into the polycrystal to produce single crystals having a size of 50 mm or more.

In the method of producing piezoelectric single crystals of the invention as described above, after the single crystal seed is attached to the polycrystalline material before the heat-treatment, the heat-treatment is performed in conditions that the abnormal grain growth is induced in a joint but suppressed inside the polycrystal so that the single crystal seed is continuously grown in the polycrystal.

In the method of producing piezoelectric single crystals of the invention as described above, the average size of the matrix grains of the polycrystal is controlled according to a following relationship: $0.5\ Rc \leq R \leq 2\ Rc$, where R is the average size of the matrix grains, and Rc is the critical size of the matrix grains at which an abnormal grain growth starts to occur and the number density of abnormal grains becomes zero.

Furthermore, in the method of producing piezoelectric single crystals of the invention as described above, in case of attempting to create and grow merely the reduced number of abnormal grains, the average size of the matrix grains of the polycrystal is controlled according to a following relationship: $0.5\ Rc \leq R \leq Rc$, where R is the average size of the matrix grains, and Rc is the critical size of the matrix grains at which an abnormal grain growth starts to occur and the number density of abnormal grains becomes zero.

Advantageous Effects

The piezoelectric single crystals and piezoelectric single crystal application parts of the invention have all of high dielectric constant ($K_3^T$), high piezoelectric constants ($d_{33}$ and $k_{33}$), high phase transition temperatures (Tc and $T_{RT}$), high coercive field (Ec) and improved mechanical properties and thus can be used in high temperature ranges and high voltage conditions.

Furthermore, the piezoelectric single crystals are produced by the solid-state single crystal growth (SSCG) method adequate for mass production of single crystals and the single crystal composition is developed not to contain expensive raw materials so that the piezoelectric single crystals can be easily commercialized. The piezoelectric and dielectric application parts using the piezoelectric single crystals of excellent properties according to the invention can be produced and used in the wide temperature range.

DESCRIPTION OF DRAWINGS

FIG. 1 is an $[A][MN]O_3$—$PbTiO_3$—$PbZrO_3$ phase diagram illustrating a composition range having excellent dielectric and piezoelectric characteristics in the morphotropic phase boundary (MPB) between a rhombohedral phase and a tetragonal phase and in regions surrounding the MPB;

FIGS. 2a and 2b are schematic views illustrating piezoelectric actuators fabricated by using piezoelectric single crystals according to the invention;

FIGS. 3a and 3b are schematic views illustrating ultrasonic transducers fabricated by using piezoelectric single crystals according to the invention;

FIG. 4 is a schematic view illustrating an ultrasonic probe fabricated by using a piezoelectric single crystal according to the invention;

FIG. 5 is a schematic view illustrating a surface acoustic wave (SAW) filter fabricated by using a piezoelectric single crystal according to the invention;

FIG. 6 is a schematic view illustrating a film capacitor fabricated by using a piezoelectric single crystal according to the invention;

FIG. 7a is a graph illustrating correlations between the average size R of matrix grains and number density ND of abnormal grains (the number of abnormal grains per unit area) and between the average size R of the matrix grains and single crystal growth rate in a polycrystal where abnormal grain growth takes place according to a method of the invention, and FIG. 7b is a graph illustrating continuous growth conditions ($0.5\ Rc \leq R \leq 2\ Rc$) of single crystal seeds (R: the mean size of the matrix grains, Rc: the critical size of the matrix grains at which an abnormal grain growth starts to occur); and FIGS. 8a and 8b are pictures illustrating polished surfaces of $[Pb_{0.97}Sr_{0.03}][(Mg_{1/3}Nb_{2/3})_{0.4}Ti_{0.35}Zr_{0.25}]O_3$ single crystals produced by the solid-state single crystal growth method; and FIG. 9 is a graph illustrating variations in dielectric constant and phase transition temperatures (Tc and $T_{RT}$) according to the change of y in produced single crystals of $[Pb_{0.97}Sr_{0.03}][(Mg_{1/3}Nb_{2/3})_{0.4}Ti_{(0.6-y)}Zr_y]O_3$.

BEST MODE

Hereinafter the present invention will be described in more detail.

Referring to FIG. 1, an $[A][MN]O_3$—$PbTiO_3$—$PbZrO_3$ phase diagram illustrates a composition range having excellent dielectric and piezoelectric characteristics in the morphotropic phase boundary (MPB) between a rhombohedral phase and a tetragonal phase and in regions surrounding the MPB. In the $[A][MN]O_3$—$PbTiO_3$—$PbZrO_3$ phase diagram, the dielectric and piezoelectric characteristics are maximized at the MPB and decrease gradually as getting farther away from the MPB. At a composition range within 5 mol % into the rhombohedral phase from the MPB composition, piezoelectric and dielectric characteristics are rarely reduced, maintaining high values. At a composition range within 10 mol % into the rhombohedral phase from the MPB composition, piezoelectric and dielectric characteristics are reduced continuously but still maintained at high characteristic values sufficient to be applied to piezoelectric and dielectric application parts. In case of composition change from the MPB to the tetragonal phase, piezoelectric and dielectric characteristics decrease more rapidly than in the rhombohedral phase area. However, even at the composition range within 5 mol % and 10 mol % into the tetragonal phase, the dielectric and piezoelectric characteristics values remain sufficiently high to be applied to piezoelectric and dielectric application parts.

In FIG. 1, the MPB between $PbTiO_3$ and $PbZrO_3$ is known as $PbTiO_3$: $PbZrO_3$=x:y=0.48:0.52 (mole fraction). In case of composition change of 5 mol % from the MPB composition to the rhombohedral and tetragonal phases, respectively, maximum values of x and y become 0.53 and 0.57, respectively. (That is, when x is the maximum, x to y is 0.53:0.47, and when y is the maximum, x to y is 0.43:0.57.) In case of composition change of 10 mol % from the MPB composition to the rhombohedral and tetragonal phases, respectively maximum values of x and y become 0.58 and 0.62, respectively. (That is, when x is the maximum, x to y is 0.58:0.42, and when y is the maximum, x to y is 0.38:0.62.) In the range of 5 mol % or less into the rhombohedral and tetragonal phases from the MPB composition, high dielectric and piezoelectric characteristics are maintained. In the range of 10 mol % or less into the rhombohedral and tetragonal phases from the MPB composition, dielectric and piezoelectric characteristics show sufficiently high values which are applicable to dielectric and piezoelectric application parts.

In FIG. 1, in a case where the contents of $PbTiO_3$ and $PbZrO_3$, that is, x and y are 0.05 or less, it is impossible to produce the MPB between the rhombohedral and tetragonal phases or phase transition temperatures and coercive fields are too low to be applied to the invention.

In formula 1 above, x preferably satisfies the relationship $0.05 \leq x \leq 0.58$. At "x" smaller than 0.05, phase transition temperatures (Tc and $T_{RT}$), piezoelectric constants ($d_{33}$ and $k_{33}$) or coercive field (Ec) is low. At "x" exceeding 0.58, dielectric constant ($K_3^T$), piezoelectric constants ($d_{33}$ and $k_{33}$) or phase transition temperature ($T_{RT}$) is low. In the meantime, "y" preferably satisfies the relationship $0.05 \leq y \leq 0.62$. At "y" smaller than 0.05, phase transition temperatures (Tc and $T_{RT}$), piezoelectric constants ($d_{33}$ and $k_{33}$) or coercive field (Ec) is low. At "y" exceeding 0.62, dielectric constant ($K_3^T$) or piezoelectric constants ($d_{33}$ and $k_{33}$) is low.

In formula 4 above, "a" preferably satisfies the relationship $0.0 \leq a \leq 0.1$, by mole fraction. At "a" exceeding 0.1, phase transition temperatures (Tc and $T_{RT}$) and piezoelectric constants ($d_{33}$ and $k_{33}$) are lowered. And "b" preferably satisfies the relationship $0.0 \leq b \leq 0.6$ because, at "b" exceeding 0.6, phase transition temperatures (Tc and $T_{RT}$), piezoelectric constants ($d_{33}$ and $k_{33}$) or coercive field (Ec) is low.

In formula 5 above, "a" is preferably in the range of $0.0 \leq a \leq 0.5$. At "a" exceeding 0.5, dielectric constant ($K_3^T$) or piezoelectric constants ($d_{33}$ and $k_{33}$) is low. And "x" is preferably, by mole fraction, in the range of $0.20 \leq x \leq 0.58$. At "x" smaller than 0.20, phase transition temperatures (Tc and $T_{RT}$) or coercive field (Ec) is low. At "x" exceeding 0.58, dielectric constant ($K_3^T$), piezoelectric constants ($d_{33}$ and $k_{33}$) or coercive field (Ec) becomes low.

In formula 6 above, "x" is preferably, by mole fraction, in the range of, $0.25 \leq x \leq 0.58$. At "x" smaller than 0.25, piezoelectric constants ($d_{33}$ and $k_{33}$), phase transition temperatures (Tc and $T_{RT}$) or coercive field (Ec) is low. At "x" exceeding 0.58, dielectric constant ($K_3^T$), piezoelectric constants ($d_{33}$ and $k_{33}$) or phase transition temperature ($T_{RT}$) is low.

In formula 7 above, "x" is, by mole fraction, in the range of $0.65 \leq x \leq 1.00$ and "y" is, by mole fraction, in the range of $0.05 \leq y \leq 0.15$. At "x" smaller than 0.65 or "y" exceeding 0.15, piezoelectric constants ($d_{33}$ and $k_{33}$), phase transition temperatures (Tc and $T_{RT}$) or coercive field (Ec) is low. At "y" smaller than 0.05, dielectric constant ($K_3^T$), piezoelectric constants ($d_{33}$ and $k_{33}$) or phase transition temperature ($T_{RT}$) becomes low.

To date, $Pb(Zr,Ti)O_3$ (PZT) is most generally used for piezoelectric ceramic polycrystals, which however contains Pb and thus leads to environmental problems. Thus, the use of lead-free piezoelectric ceramic materials which do not contain Pb is required without delay. However, those lead-free piezoelectric ceramic materials developed to date do not ensure properties that can match those of PZT ceramic materials and thus the use of the former is restricted. Single crystalline materials as in PMN—PT and so on provide piezoelectric characteristics generally two times higher than those of polycrystals. Therefore, sharp rise in the piezoelectric characteristics are expectable from the lead-free piezoelectric ceramic materials when they are produced in a single crystal. However, lead-free piezoelectric single crystals can be rarely produced by current single crystal growth methods and thus research and development for the lead-free piezoelectric single crystals are restricted. A solid-state single crystal growth method according to the present invention enables production of lead-free piezoelectric single crystals so that the lead-free piezoelectric single crystals can be mass produced economically and thus replace the existing PZT ceramic materials containing toxic lead (Pb).

One of methods for improving mechanical properties of brittle materials such as ceramic polycrystals and glasses is to add or dope reinforcing agent or reinforcing second phase into the polycrystals thereby to suppress or obstruct the growth of cracks. The reinforcing second phase can suppress the growth of cracks, resultantly restricting the fracture of the materials and improving mechanical properties thereof. The reinforcing second phase is required to be chemically stable inside the materials as well as to maintain the second phase state independent from the matrix phase. Examples of the reinforcing second phase may include metals, oxides and pores. This invention, as the reinforcing phase, employs those second phases that are chemically stable in the piezoelectric single crystals having the composition of any of formulas 1 to 7 above and capable of suppressing the growth of cracks. Piezoelectric single crystals including the reinforcing second phase can be referred to as second phase-reinforced single crystal or reinforced piezoelectric single crystal composites.

As an element added to the composition according to any one of formulas 1 to 7 above, P is added preferably, by volume fraction with respect to the entire composition, in the range of 0.1% to 20%. At P smaller than 0.1%, the amount of P added is too small to affect the mechanical properties or improve dielectric and piezoelectric characteristics of the single crystal. On the other hand, P exceeding 20% may adversely affect the mechanical properties or dielectric and piezoelectric characteristics of the single crystal.

The piezoelectric single crystal of the invention preferably has Curie temperature Tc of 180° C. or more. At Curie temperature under 180° C., it is difficult to raise coercive field Ec to 5 kV/cm or more or phase transition temperature $T_{RT}$ to 100° C. or more.

The piezoelectric single crystal of the invention preferably has electro-mechanical coupling coefficient $k_{33}$ of 0.85 or more. At $k_{33}$ under 0.85, characteristics of the piezoelectric single crystal become similar to those of piezoelectric polycrystalline ceramics and energy conversion efficiency thereof is lowered.

The piezoelectric single crystal of the invention preferably has coercive electric field of 5 kV/cm or more. At coercive field smaller than 5 kV/cm, poling is readily removed in the processing of the piezoelectric single crystal, the fabrication of piezoelectric single crystal application parts or the use thereof.

In a method of producing piezoelectric single crystals according to the invention, the average size R of the matrix grains of the polycrystal is preferably controlled according to the relationship: $0.5\ Rc \leq R \leq 2\ Rc$, where Rc is the critical size of the matrix grains at which an abnormal grain growth starts to occur (the average size of the matrix grains where the number density of the abnormal grains becomes zero). At the average size of the matrix grains of the polycrystal smaller than 0.5 Rc (0.5 Rc>R), the number density of the abnormal grains is too high to drive single crystal growth. At the average size of the matrix grains of the polycrystal larger than 2 Rc (2 Rc<R), the number density of the abnormal grains is zero (0) but single crystal growth rate is too slow to produce a large sized single crystal.

In the method of producing piezoelectric single crystals according to the invention, in a case where only very limited number of abnormal grains of the polycrystal under the state that the number density of abnormal grains is reduced are continuously grown to produce a single crystal, the average size R of the matrix grains of the polycrystal is preferably controlled according to the relationship: $0.5\ Rc \leq R \leq Rc$, where Rc is the critical size of the matrix grains at which an abnormal grain growth starts to occur (the average size of the matrix grains where the number density of the abnormal grains becomes zero). The condition necessary for the reduced number of abnormal grains to be created and grown is $0.5\ Rc \leq R \leq Rc$. At R smaller than 0.5 Rc, the number density of abnormal grains created is too high and thus it is impossible to grow only the reduced number of abnormal grains. At R larger than Rc, the abnormal grains are not created at all and thus it is impossible to control the abnormal grains within the above range.

Perovskite-type crystal structures are expressed by [A][B]$O_3$, and classified into a simple Perovskite structure where A indicates +2 ions and B indicates +4 ions and a complex Perovskite structure where A and B indicate +2 and +5 ions, +3 and +5 ions or +2 and +6 ions, respectively.

However, since there is no difference in crystal structures between the simple and complex Perovskite structures, the piezoelectric single crystals of this invention may have any one of the simple and complex Perovskite structures.

$PbZrO_3$ has a high phase transition temperature (Tc) of 230° C. (see Table 1 above). Since the MPB is made more vertical with respect to temperature axis, it is possible to obtain high $T_{RT}$ while maintaining high Tc. Therefore, it is also possible to develop a composition where both of Tc and $T_{RT}$ are high at the same time. In a case where $PbZrO_3$ is added to existing piezoelectric single crystal compositions, phase transition temperature rises also in proportion to the content of $PbZrO_3$. Accordingly, the piezoelectric single crystal having a Perovskite crystal structure containing Zr or $PbZrO_3$ can overcome problems of the existing piezoelectric single crystals. Furthermore, zirconia ($ZrO_2$) or $PbZrO_3$ is a cheap material used as a major component of the existing piezoelectric polycrystalline ceramics and thus can achieve the object of the invention without high raw material cost problem.

It has been known up to now that general single crystal growth methods cannot produce the piezoelectric single crystal having a Perovskite crystal structure containing Zr or $PbZrO_3$. The piezoelectric single crystal having a Perovskite structure containing Zr or $PbZrO_3$, when melted, shows an incongruent melting behavior unlike PMN—PT or PZN—PT that shows a congruent melting behavior. In case of the incongruent melting behavior, when a solid phase is melted, it is decomposed into liquid phase and solid $ZrO_2$ phase. Here, solid zirconia grains in the liquid phase disturb single crystal growth so that single crystals cannot be grown by flux or Bridgman method that is a general single crystal growth method using a melting process. Since it is difficult to produce the piezoelectric single crystal having a Perovskite structure containing Zr or $PbZrO_3$, dielectric and piezoelectric characteristics of the single crystal have not been reported up to now. In particular, there have been no report to date about changes in piezoelectric characteristics ($d_{33}$ and $k_{33}$), phase transition temperatures (Tc and $T_{RT}$) and coercive field (Ec) according to $PbZrO_3$ contents.

It is difficult to produce single crystals containing a reinforcing second phase according to the general single crystal growth methods including the melting process and there has been no report about it to date. The reinforcing phase is unstable and thus reacts chemically with a liquid phase at a temperature range of melting temperature or more and thus disappears without remaining the independent second phase. In addition, in the liquid phase, the second phase is separated from the liquid phase due to different densities, and thus it is more difficult to produce a single crystal containing the second phase. Furthermore, it is impossible to control the volume fraction, size, shape, arrangement and distribution of the reinforcing second phase within the single crystal.

The present invention produces piezoelectric single crystals containing a reinforcing second phase by using a solid-state single crystal growth (SSCG) method free from a melting process. In this SSCG method, single crystal growth starts to occur below melting temperature of the single crystal. This as a result suppresses chemical reaction between the reinforcing second phase and the single crystal and the reinforcing single phase can exist stably in an independent status inside the single crystal. In addition, the single crystal growth takes place in the polycrystal containing the reinforcing phase, and there are no changes in the volume fraction, size, shape, arrangement, distribution and so on of the reinforcing phase during the single crystal growth. Accordingly, in the process of producing a polycrystal containing a reinforcing second phase if the reinforcing second phase of the polycrystal is controlled in volume fraction, size, shape, arrangement, distribution and so on, and have a single crystal grown, it is possible to produce a desired shape of second phase-reinforced single crystal, i.e., a single crystal containing a reinforcing second phase in desired volume fraction, size, shape, arrangement, distribution and so on.

In this invention, piezoelectric single crystals having a Perovskite structure containing Zr are produced by using the solid-state single crystal growth method different from the existing single crystal growth methods. The SSCG method can produce the piezoelectric single crystals having a Perovskite structure containing Zr since it does not adopt a melting process unlike the existing single crystal growth methods. Furthermore, this method can produce the piezoelectric single crystals having a Perovskite structure containing $PbZrO_3$ which have a complicated composition containing several elements but chemically uniform.

Piezoelectric application parts using piezoelectric bodies containing a novel piezoelectric single crystal having a Perovskite structure according to the invention may include ultrasonic transducers (e.g., medical ultrasonic transducer, sonar transducer, nondestructive testing transducer, ultrasonic cleaner, and ultrasonic motor), piezoelectric actuators (e.g., $d_{33}$-type actuator, $d_{31}$-type actuator, $d_{15}$-type actuator, piezoelectric actuator for micro-positioning, piezoelectric pump, piezoelectric valve and piezoelectric speaker), piezoelectric sensors (e.g., piezoelectric accelerometer) and so on.

Dielectric application parts using the piezoelectric bodies containing a piezoelectric single crystal having a Perovskite structure according to the invention may include high efficiency capacitors, infrared sensors, dielectric filters and so on.

Examples of piezoelectric application parts using the piezoelectric single crystal of the invention may be actuators as shown in FIGS. 2a and 2b. Each of the actuators 10 shown in FIG. 2a (a $d_{33}$-type actuator) and FIG. 2b (a $d_{31}$-type actuator) includes a piezoelectric body 12 containing a piezoelectric single crystal of the invention, which is surrounded by conductive electrodes 14 and 16. The piezoelectric body 12 contains the piezoelectric single crystal having a composition corresponding to one of formulas 1 to 12 above, and has a crystal axis orientation typically as shown in a coordinate system 20. When a voltage V is applied between the electrodes 14 and 16, the piezoelectric body 12 is piezoelectrically strained mainly in the direction as indicated by an arrow 24.

Another examples of the piezoelectric application parts using the piezoelectric body containing the piezoelectric single crystal of the invention may be ultrasonic transducers 20 shown in FIGS. 3a and 3b. FIG. 3a illustrates an exploded assembly view of the ultrasonic transducer 20 of a 2-2 composite, which includes a plurality of piezoelectric elements 22 having a piezoelectric single crystal of the invention, polymer layers 24 and electrodes 26 and 28. FIG. 3b illustrates an exploded assembly view of the ultrasonic transducer 30 of a 1-3 composite, which includes a plurality of single crystal piezoelectric elements 32 having a piezoelectric single crystal of the invention, polymer layers 34 and electrodes 36 and 38.

Further another example of the piezoelectric application parts of the invention may be an ultrasonic probe 40 shown in FIG. 4. The ultrasonic probe 40 shown in FIG. 4 includes piezoelectric elements 41 having a single crystal of the invention, an ultrasonic transmitting/receiving element having a pair of electrodes 42a and 42b arranged on an ultrasonic transmitting/receiving face and an opposing face of the piezoelectric element 41, acoustic matching layers 43a and 43b formed on the electrode 42a connected to the transmitting/receiving face, an acoustic lens 44, a base electrode plate 46a connected to first and second electrodes and a flexible PCB 46b. The acoustic lens 44 is arranged to cover the entire acoustic matching layer. The base electrode plate 46a is bonded to the first electrode 42a by an adhesive, and the flexible PCB 46b having a plurality of cables is bonded to the second electrode 42b.

As further another example of the piezoelectric application parts of the invention, an SAW filter as shown in FIG. 5 may be provided. Referring to FIG. 5, the SAW filter includes a substrate composed of piezoelectric single crystals of the invention, an input converter and an output converter.

Still another example of the dielectric application parts using a dielectric material of the invention may be a film capacitor shown in FIG. 6. The film capacitor shown in FIG. 6 has an insulating layer 52 of for example silicon oxide formed on a Si substrate 51. A lower electrode 53 of for example Pt is formed on the insulating layer 52, and a dielectric layer 54 composed of a piezoelectric single crystal of the invention and having a high dielectric constant is formed on the lower electrode 53. Then, an upper electrode 59 of for example Pt is formed on the dielectric layer 54.

Mode for Invention

Hereinafter detailed description will be made of variations in dielectric constant, piezoelectric constant, phase transition temperature and coercive field value according to piezoelectric single crystal composition of the invention with reference to the accompanying drawings.

Example 1

In Example 1, single crystals having a composition of [Pb][(Mg$_{1/3}$Nb$_{2/3}$)$_{(1-x-y)}$Ti$_x$Zr$_y$]O$_3$ ($0.25 \leq x \leq 0.58$; $0.05 \leq y \leq 0.62$) were produced by a solid-state single crystal growth method, and variations in dielectric constant, piezoelectric constant, phase transition temperature and coercive field value according to change in Zr content were measured.

Production of Single Crystal

In Example 1, ceramic powders having compositions of [Pb][(Mg$_{1/3}$Nb$_{2/3}$)$_{(1-x-y)}$Ti$_x$Zr$_y$]O$_3$ ($0.25 \leq x \leq 0.58$; $0.05 \leq y \leq 0.62$) were prepared by using a columbite method. First, MgO and Nb$_2$O$_5$ powders were mixed through ball milling and then calcined to produce MgNb$_2$O$_6$. And PbO, MgNb$_2$O$_6$, TiO$_2$ and ZrO$_2$ powders were mixed and calcined to produce Perovskite powder having compositions reported in Table 2. An excess PbO was added into the resultant [Pb][(Mg$_{1/3}$Nb$_{2/3}$)$_{(1-x-y)}$Ti$_x$Zr$_y$]O$_3$ powder to produce mixture-powder. The resultant mixture-powder was molded and then pressure-molded at a hydrostatic pressure of 200 MPa. Powder-molded bodies were heat-treated at several temperatures with an interval of 25° C. in the range from 900° C. to 1,300° C., for up to 100 hours. As conditions for the average size R of matrix grains of a polycrystalline body to be controlled in the range of 0.5 Rc$\leq$R$\leq$2 Rc, where Rc is the critical size at which an abnormal grain growth starts to occur or the number density of abnormal grains becomes zero (0), the overdose of PbO addition was determined to be the range from 10 to 20 mol %, and the heat-treatment temperature range was determined to be from 1,000° C. to 1,150° C. On the polycrystalline bodies produced as above, single crystal seeds of Ba(Ti$_{0.7}$Zr$_{0.3}$)O$_3$ were placed and heat-treated. By using continuous growth of the single crystal seed into the polycrystal, a single crystal was produced with the same composition of the polycrystalline body.

When the average size R of the polycrystalline matrix grains was controlled to be in the range of 0.5 Rc$\leq$R$\leq$2 Rc, the single crystal seed grew continuously into the polycrystalline body. In Example 1, when the overdose of PbO and the heat-treatment temperatures were adjusted, it was possible to control the average size R of the polycrystalline matrix grains in the range of 0.5 Rc$\leq$R$\leq$2 Rc. When the average size R of the polycrystalline matrix grains was controlled in the range of 0.5 Rc$\leq$R$\leq$2 Rc, the single crystal seeds of Ba(Ti$_{0.7}$Zr$_{0.3}$)O$_3$ continuously grew into the polycrystalline bodies of [Pb][(Mg$_{1/3}$Nb$_{2/3}$)$_{(1-x-y)}$Ti$_x$Zr$_y$]O$_3$ ($0.25 \leq x \leq 0.58$; $0.05 \leq y \leq 0.6$) during the heat-treatment, thereby producing single crystals with the same composition as the polycrystalline bodies. The size of fully grown-up single crystals was 10λ×10 mm$^2$ or more.

Measurement of Electro-mechanical Coupling Coefficient ($k_{33}$)

The electro-mechanical coupling coefficients $k_{33}$ of the produced single crystals were measured according to an IEEE method by using Impedance Analyser HP4294A. As a result of measurement, variations by the compositions in the electro-mechanical coupling coefficients $k_{33}$ were reported in Table 2 below.

TABLE 2

| 1 − x − y | x/y | x/y | x/y (~MPB) | x/y | x/y | x/y | x/y |
|---|---|---|---|---|---|---|---|
| 0.6 | — | — | 0.35/0.05 (0.92) | 0.34/0.06 (0.91) | 0.33/0.07 (0.90) | 0.32/0.08 (0.89) | 0.31/0.09 (0.89) |
| 0.55 | 0.37/0.08 (0.88) | 0.36/0.09 (0.89) | 0.35/0.1 (0.91) | 0.34/0.11 (0.91) | 0.33/0.12 (0.90) | 0.32/0.13 (0.90) | 0.31/0.14 (0.89) |
| 0.5 | 0.38/0.12 (0.88) | 0.37/0.13 (0.89) | 0.36/0.14 (0.90) | 0.35/0.15 (0.90) | 0.34/0.16 (0.89) | 0.33/0.17 (0.89) | 0.32/0.18 (0.88) |
| 0.45 | 0.39/0.16 (0.88) | 0.38/0.17 (0.90) | 0.37/0.18 (0.91) | 0.36/0.19 (0.90) | 0.35/0.2 (0.90) | 0.34/0.21 (0.89) | 0.33/0.22 (0.89) |
| 0.4 | 0.40/0.20 (0.88) | 0.39/0.21 (0.89) | 0.38/0.22 (0.90) | 0.37/0.23 (0.90) | 0.36/0.24 (0.90) | 0.35/0.25 (0.89) | 0.34/0.26 (0.88) |
| 0.35 | 0.41/0.24 (0.89) | 0.4/0.25 (0.90) | 0.39/0.26 (0.91) | 0.38/0.27 (0.90) | 0.37/0.28 (0.90) | 0.36/0.29 (0.89) | 0.35/0.30 (0.89) |

TABLE 2-continued

| 1 − x − y | x/y | x/y | x/y (~MPB) | x/y | x/y | x/y | x/y |
|---|---|---|---|---|---|---|---|
| 0.3 | 0.42/0.28 (0.89) | 0.41/0.29 (0.90) | 0.4/0.3 (0.91) | 0.39/0.31 (0.91) | 0.38/0.32 (0.90) | 0.37/0.33 (0.90) | 0.36/0.34 (0.88) |
| 0.25 | 0.42/0.33 (0.88) | 0.41/0.34 (0.88) | 0.4/0.35 (0.90) | 0.39/0.36 (0.89) | 0.38/0.37 (0.90) | 0.37/0.38 (0.89) | 0.36/0.39 (0.88) |
| 0.2 | 0.43/0.37 (0.88) | 0.42/0.38 (0.90) | 0.41/0.39 (0.91) | 0.4/0.4 (0.90) | 0.39/0.41 (0.90) | 0.38/0.42 (0.88) | 0.37/0.43 (0.89) |
| 0.15 | 0.44/0.41 (0.89) | 0.43/0.42 (0.90) | 0.42/0.43 (0.90) | 0.41/0.44 (0.90) | 0.4/0.45 (0.90) | 0.39/0.46 (0.89) | 0.38/0.47 (0.89) |
| 0.1 | 0.45/0.45 (0.88) | 0.44/0.46 (0.90) | 0.43/0.47 (0.90) | 0.42/0.48 (0.89) | 0.41/0.49 (0.89) | 0.4/0.5 (0.88) | 0.39/0.51 (0.88) |

As seen in Table 2 above, all of the electro-mechanical coupling coefficients $k_{33}$ were 0.85 or more throughout the measured compositions.

Measurement of Dielectric and Piezoelectric Characteristics

In the $[Pb][(Mg_{1/3}Nb_{2/3})_{(1-x-y)}Ti_xZr_y]O_3$ ($0.2 \leq x \leq 0.58$; $0.05 \leq y \leq 0.62$) single crystals produced as above, variations in dielectric constant, phase transition temperatures (Tc and $T_{RT}$), piezoelectric constant, and coercive electric field value according to change in y were measured according to an IEEE method by using an impedance analyser, and results are reported in Table 3 below.

TABLE 3

| | x/y | | | | | |
|---|---|---|---|---|---|---|
| | 0.38/0.22 | 0.37/0.23 | 0.36/0.24 | 0.35/0.25 | 0.34/0.26 | 0.33/0.27 |
| Dielectric Constant ($K_3^T$) | 6,000 | 7,500 | 7,000 | 6,500 | 5,500 | 5,500 |
| Tc/$T_{RT}$ [° C.] | 235/100 | 230/100 | 235/125 | 230/140 | 240/155 | 235/170 |
| $d_{33}$ [pC/N] | 1,800 | 2,000 | 1,900 | 1,700 | 1,600 | 1,500 |
| $k_{33}$ | 0.90 | 0.90 | 0.90 | 0.89 | 0.88 | 0.88 |
| Ec [kV/cm] | 6 | 5.5 | 6 | 5.5 | 6.5 | 6 |

In the compositions seen in Table 3 above, as y increased from 0.22 to 0.27, Tc maintained a substantially constant temperature on the order of 230° C. but $T_{RT}$ continuously increased from 100° C. to 170° C. By varying y, i.e., the content of Zr throughout the entire piezoelectric single crystal composition, it was possible to maintain both of the phase transition temperatures (Tc and $T_{RT}$) as well as the dielectric and piezoelectric properties at high values.

The single crystals produced in Example 1 had higher properties as the single crystal composition belonging to rhombohedral phase was closer to the MPB. As getting farther away from the MPB (as y increasing), the dielectric and piezoelectric characteristics decreased but, on the other hand, $T_{RT}$ increased. The piezoelectric single crystals having a Perovskite structure containing Zr or $PbZrO_3$, which is rhombohedral but closer to MPB composition, showed at a specific composition all of the following properties: dielectric constant of $K_3^T \geq 4,000$; piezoelectric constant of $d_{33} \geq 1,400$ pC/N and $k_{33} \geq 0.85$; phase transition temperatures of Tc $\geq 180°$ C. and $T_{RT} \geq 100°$ C.; and coercive field of Ec $\geq 5$ kV/cm.

Example 2

In Example 2, reinforced piezoelectric single crystals having a composition of $[Pb][(Mg_{1/3}Nb_{2/3})_{(1-x-y)}Ti_xZr_y]O_3+cP$ ($0.25 \leq x \leq 0.58$; $0.05 \leq y \leq 0.62$; $0.001 \leq c \leq 0.20$) were produced by adding reinforced secondary phases by the volume fraction from 0.1% to 20% into the compositions of $[Pb][(Mg_{1/3}Nb_{2/3})_{(1-x-y)}Ti_xZr_y]O_3$ ($0.25 \leq x \leq 0.58$; $0.05 \leq y \leq 0.62$), and variations in dielectric constant, piezoelectric constant, phase transition temperature, coercive field value, and fracture strength according to change in kind and content of the reinforcing secondary phases were measured.

Production of Single Crystal

In order to produce piezoelectric single crystals having a Perovskite structure containing a secondary phase reinforcing agent, P (one or more selected from the group including Au, Ag, Pt, Pd, Rh, MgO, $ZrO_2$, and pores) was added by the volume fraction from 0.1% to 20% ($0.001 \leq c \leq 0.20$) into the piezoelectric ceramic powders having a Perovskite structure to produce polycrystals, and single crystals were produced by a solid-state single crystal growth method, using the produced polycrystals.

In this example, first, ceramics powders having a composition of $[Pb][(Mg_{1/3}Nb_{2/3})_{(1-x-y)}Ti_xZr_y]O_3$ ($0.25 \leq x \leq 0.58$; $0.05 \leq y \leq 0.62$) were produced according to the example 1, x/y values were set to 0.38/0.22, 0.37/0.23, 0.36/0.24, 0.35/0.25, 0.34/0.26, 0.33/0.27, respectively. To the produced powders having a composition of $[Pb][(Mg_{1/3}Nb_{2/3})_{(1-x-y)}Ti_xZr_y]O_3$, MgO powders (P=MgO), Pt powders (P=Pt), and PMMA (polymethyl methacrylate) polymer (P=pore) were respectively added, together with the overdose of PbO powders. Since PMMA was decomposed and eliminated during heat-treatment, pores were formed inside the polycrystals and single crystals after the heat-treatment. Resultant powder-molded bodies were heat-treated at several temperatures with an interval of 25° C. in the range from 900° C. to 1,300° C., for up to 100 hours.

Through such heat-treatment, polycrystals having a composition of $[Pb][(Mg_{1/3}Nb_{2/3})_{(1-x-y)}Ti_xZr_y]O_3+cMgO$, $[Pb][(Mg_{1/3}Nb_{2/3})_{(1-x-y)}Ti_xZr_y]O_3+cPt$, and $[Pb][(Mg_{1/3}Nb_{2/3})_{(1-x-y)}Ti_xZr_y]O_3+c(Pore)$ ($0.25 \leq x \leq 0.58$; $0.05 \leq y \leq 0.62$; $0.001 \leq c \leq 0.20$) were produced.

As conditions for the average size R of polycrystalline matrix grains to be controlled in the range of $0.5 R_c \leq R \leq 2 R_c$, the overdose of PbO addition was determined to be 20 mol %, and the heat-treatment temperature range was determined to be 1,100° C. On the polycrystalline bodies produced as above, single crystal seeds of $Ba(Ti_{0.7}Zr_{0.3})O_3$ were placed, accompanied by heat-treatment. By using continuous growth of the single crystal seed into the polycrystals, single crystals were produced with polycrystal compositions. That is, when the overdose of PbO was added by 20 mol % to the prepared powders, the polycrystals were heat-treated at 1,100° C. for 300 hours, and on the polycrystalline bodies produced, single crystal seeds of $Ba(Ti_{0.7}Zr_{0.3})O_3$ were placed, accompanied by heat-treatment, the single crystal seeds were continuously grown, so that single crystals were produced with polycrystal compositions.

When the mean size R of the polycrystalline matrix grains was controlled to be in the range of $0.5\ R_c \leqq R \leqq 2\ R_c$, the single crystal seed grew continuously into the polycrystalline molding. In this Example, when the overdose of PbO and the heat-treatment temperatures were adjusted, it was possible to control the average size R of the polycrystalline matrix grains in the range of $0.5\ R_c \leqq R \leqq 2\ R_c$. When the average size R of the polycrystalline matrix grains was controlled in the range of $0.5\ R_c \leqq R \leqq 2\ R_c$, the single crystal seeds of $Ba(Ti_{0.7}Zr_{0.3})O_3$ continuously grew into the polycrystalline bodies during the heat-treatment, thereby producing single crystals with the same composition as the polycrystalline bodies. The size of fully grown-up single crystals was $15 \times 15\ mm^2$ or more.

Measurement of Fracture Strength

The fracture strengths of the single crystals containing reinforcing secondary phases produced in example 2 were measured by 4-point bending test method according to an ASTM method.

The results thereof were shown in Table 4 below.

TABLE 4

| | x/y [MPa] | | | | | |
|---|---|---|---|---|---|---|
| | 0.38/0.22 | 0.37/0.23 | 0.36/0.24 | 0.35/0.25 | 0.34/0.26 | 0.33/0.27 |
| c = 0.0 | 45 ± 15 | 45 ± 15 | 45 ± 15 | 45 ± 15 | 45 ± 15 | 45 ± 15 |
| c = 0.01, P = MgO | 49 ± 15 | 49 ± 15 | 49 ± 15 | 49 ± 15 | 49 ± 15 | 49 ± 15 |
| c = 0.05, P = Pt | 54 ± 15 | 54 ± 15 | 54 ± 15 | 54 ± 15 | 54 ± 15 | 54 ± 15 |

As shown in Table 4, the single crystals having a composition of $[Pb][(Mg_{1/3}Nb_{2/3})_{(1-x-y)}Ti_xZr_y]O_3$ ($0.25 \leqq x \leqq 0.58$; $0.05 \leqq y \leqq 0.62$) had similar fracture strengths of 45±15 MPa, irrespective of the variations in composition. The single crystals containing therein 0.01 MgO and 0.005 Pt had fracture strengths of 49±15 MPa and 54±15 MPa, respectively. Further, when pores were contained in the single crystals by volume fraction of 20% or less, the fracture strength was increased to 50±20 MPa.

Measurement of Piezoelectric Characteristic

In the $[Pb][(Mg_{1/3}Nb_{2/3})_{(1-x-y)}Ti_xZr_y]O_3+cP$ ($0.25 \leqq x \leqq 0.58$; $0.05 \leqq y 0.62$; $0.001 \leqq c \leqq 0.20$) reinforced piezoelectric single crystals produced according to example 2, characteristics such as phase transition temperatures and piezoelectric constant according to change in y were measured according to an IEEE method by using an impedance analyser. Phase transition temperatures of the single crystals produced were not substantially changed by addition of secondary phases, and results of dielectric constant and piezoelectric constant were reported in Table 5 below. Further, when Pt particles were added to $[Pb][(Mg_{1/3}Nb_{2/3})_{(1-x-y)}Ti_xZr_y]O_3$ (x=0.34, y=0.26) single crystals in a volume fraction thereof from 0% to 15%, variation in dielectric constant of the piezoelectric signal crystals was reported in Table 6.

TABLE 5

| | | x/y | | | | | |
|---|---|---|---|---|---|---|---|
| | | 0.38/0.22 | 0.37/0.23 | 0.36/0.24 | 0.35/0.25 | 0.34/0.26 | 0.33/0.27 |
| Tc/$T_{RT}$ [° C.] | c = 0.0 | 235/100 | 230/100 | 235/125 | 230/140 | 240/155 | 235/170 |
| | c = 0.01, P = MgO | 235/100 | 230/100 | 235/125 | 230/140 | 240/155 | 235/170 |
| | c = 0.005, P = Pt | 235/100 | 230/100 | 235/125 | 230/140 | 240/155 | 235/170 |
| Dielectric Constant ($K_3^T$) | c = 0.0 | 6,000 | 7,500 | 7,000 | 6,500 | 5,500 | 5,500 |
| | c = 0.01, P = MgO | 5,700 | 7,100 | 6,700 | 6,300 | 5,200 | 5,100 |
| | c = 0.005, P = Pt | 6,300 | 7,600 | 7,200 | 6,800 | 5,700 | 5,600 |
| $k_{33}$ | c = 0.0 | 0.90 | 0.90 | 0.90 | 0.89 | 0.88 | 0.88 |
| | c = 0.01, P = MgO | 0.87 | 0.89 | 0.89 | 0.88 | 0.88 | 0.87 |
| | c = 0.005, P = Pt | 0.87 | 0.89 | 0.89 | 0.87 | 0.86 | 0.86 |
| Ec [kV/cm] | c = 0.0 | 6 | 5.5 | 6 | 5.5 | 6.5 | 6 |
| | c = 0.01, P = MgO | 6.5 | 6 | 6 | 6 | 6.5 | 6.5 |
| | c = 0.005, P = Pt | 5.8 | 5.3 | 5.7 | 5.3 | 6.1 | 5.9 |

TABLE 6

| x/y = 0.34/0.26 | |
|---|---|
| Volume Fraction of Pt | Dielectric Constant ($K_3^T$) |
| 0.00 | 5,500 |
| 0.005 | 5,700 |
| 0.02 | 6,300 |
| 0.05 | 6,700 |
| 0.10 | 7,100 |
| 0.15 | 7,500 |

Analysis of Results

Characteristics of the single crystals produced in this example were improved in fracture strength and mechanical toughness thereof when the secondary phases such as MgO, Pt, and pores were added thereto in the range from 0.1% to 20% ($0.001 \leq c \leq 0.20$). Further, when Pt particles that are conductive metal were scattered in the single crystals, a dielectric characteristic thereof were continuously increased in proportion to the content of Pt particles. Thus, the piezoelectric single crystals having a Perovskite structure containing Zr, which includes secondary phases, such as MgO, Pt, and pores, showed at a specific composition all of the following properties: dielectric constant of $K_3^T \geq 4,000$; piezoelectric constant of $d_{33} \geq 1,400$ pC/N and $k_{33} \geq 0.85$; phase transition temperatures of $Tc \geq 180°$ C. and $T_{RT} \geq 100°$ C.; and coercive field of $Ec \geq 5$ kV/cm, and had improved mechanical properties, as compared to those not including the secondary phases such as MgO, Pt or the like.

Example 3

Example 3-1

In this Example, single crystals having a composition of $[Pb_{0.97}Sr_{0.03}][(Mg_{1/3}Nb_{2/3})_{0.4}Ti_{(0.6-y)}Zr_y]O_3$ ($0.05 \leq y \leq 0.62$) were produced by a solid-state single crystal growth method, and variations in dielectric constant, piezoelectric constant, phase transition temperatures and coercive field value according to change in Zr content were measured. In the Example, single crystals were grown from Perovskite ceramic powders having a composition of $[Pb_{0.97}Sr_{0.03}][(Mg_{1/3}Nb_{2/3})_{0.4}Ti_{(0.6-y)}Zr_y]O_3$ ($0.05 \leq y \leq 0.62$) by using a method like in <Example 1>, and y values were set to 0.19, 0.21, 0.23, 0.25, 0.27, 0.29, and 0.31, respectively. An overdose of PbO powders was added into the resultant Perovskite powders while varying the content thereof into 0, 5, 10, 15, 20, 25, and 30 mol %, to thereby produce PbO-contained powders having several compositions. PbO-contained powder-molded bodies were heat-treated at several temperatures with an interval of 25° C. in the range from 900° C. to 1,300° C., for up to 100 hours, and were examined for abnormal grain growth behavior and the number density of abnormal grains of the polycrystals. As conditions for the average size R of polycrystalline matrix grains to be controlled in the range of $0.5 \text{ Rc} \leq R \leq 2 \text{ Rc}$, where Rc is the critical size at which an abnormal grain growth starts to occur, the overdose of PbO addition was determined to be 20 mol %, and the heat-treatment temperature range was determined to be from 1,100° C. to 1,150° C. In the Example, the size of the polycrystalline matrix grains was controlled by the control of the overdose of PbO addition and the heat-treatment temperature. However, in addition, the size could be controlled by the control of heat-treatment time and atmosphere (an oxygen partial pressure $P_{O2}$ around a sample), a PbO partial pressure $Pp_{PbO}$ around a sample, and the like. That is, on the polycrystalline bodies produced such that the average size of the polycrystalline matrix grains was controlled and the number density of abnormal grains was reduced through the heat-treatment at 1150° C., single crystal seeds of $Ba(Ti_{0.7}Zr_{0.3})O_3$ were placed, accompanied by heat-treatment at 1100° C. for 300 hours. By using continuous growth of the single crystal seed into the polycrystal, single crystals were produced with polycrystal compositions (Production of single crystals by two-step heat-treatment).

Example 3-2

The inventors produced single crystals by continuously growing only abnormal grains produced in the polycrystals, using ceramic powders having a composition of $[Pb_{0.97}Sr_{0.03}]$ $[(Mg_{1/3}Nb_{2/3})_{0.4}Ti_{(0.6-y)}Zr_y]O_3$ ($0.05 \leq y \leq 0.62$), without single crystal seeds. The inventors produced Perovskite ceramic powders by a method as used in the above test, added an dose of PbO powders thereto, and carried out heat-treatment. As a result, as conditions for the average size R of polycrystalline matrix grains to be controlled in the range of $0.5 \text{ Rc} \leq R \leq Rc$, the overdose of PbO addition was determined to be 30 mol %, and the heat-treatment temperature range was determined to be 1050° C. The single crystals were produced by adding the overdose of PbO by 30 mol % determined as above to the ceramics powders having a composition of $[Pb_{0.97}Sr_{0.03}][(Mg_{1/3}Nb_{2/3})_{0.4}Ti_{(0.6-y)}Zr_y]O_3$ ($0.05 \leq y \leq 0.62$), and heat-treating once at 1050° C. for 500 hours, thereby continuously growing only a few abnormal grains naturally created in the polycrystals (Production of single crystals by one heat-treatment).

Observation of Single Crystals

FIG. 8 shows photographs of the polished surfaces of the single crystals of $[Pb_{0.97}Sr_{0.03}][(Mg_{1/3}Nb_{2/3})_{0.4}Ti_{0.35}Zr_{0.25}]O_3$ (y=0.25) produced by a solid-state single crystal growth method, wherein single crystals were observed. FIG. 8a shows a photograph of a single crystal produced by heat-treating, at 1100° C. for 300 hours, single crystal seeds of $Ba(Ti_{0.7}Zr_{0.3})O_3$ placed on the polycrystalline bodies produced by adding the overdose of PbO by 20 mol % to the powders of $[Pb_{0.97}Sr_{0.03}][(Mg_{1/3}Nb_{2/3})_{0.4}Ti_{0.35}Zr_{0.25}]O_3$ produced according to the example 3-1, and heat-treating at 1150° C. When the mean size R of the polycrystalline matrix grains was controlled to be in the range of $0.5 \text{ Rc} \leq R \leq 2 \text{ Rc}$, where Rc is the critical size at which an abnormal grain growth starts to occur, the single crystal seeds grew continuously into the polycrystalline bodies. In the Example, when the overdose of PbO and the heat-treatment temperatures were adjusted, it was possible to control the average size R of the polycrystalline matrix grains in the range of $0.5 \text{ Rc} \leq R \leq 2$ Rc. When the average size R of the polycrystalline matrix grains was controlled in the range of $0.5 \text{ Rc} \leq R \leq 2 \text{ Rc}$, the single crystal seeds of $Ba(Ti_{0.7}Zr_{0.3})O_3$ continuously grew into the polycrystalline bodies during the heat-treatment, thereby producing single crystals with the same composition as the polycrystalline bodies. The size of fully grown-up single crystals was 30×25 mm² or more.

FIG. 8b shows a photograph of a single crystal produced by adding the overdose of PbO by 30 mol % to $[Pb_{0.97}Sr_{0.03}]$ $[(Mg_{1/3}Nb_{2/3})_{0.4}Ti_{0.35}Zr_{0.25}]O_3$ powders, and heat-treating the mixture at 1050° C. for 500 hours, according to Example 3-2. When the mean size R of the polycrystalline matrix grains was controlled to be in the range of $0.5 \text{ Rc} \leq R \leq 1 \text{ Rc}$, the number density of abnormal grains in the polycrystals was decreased, to thereby continuously grow only a few abnormal grains. In the Example, when the overdose of PbO and the heat-treatment temperatures were adjusted, it was possible to control the average size R of the polycrystalline matrix grains in the range of $0.5 Rc \leq R \leq Rc$. When the average size R of the polycrystalline matrix grains was controlled in the range of $0.5 Rc \leq R \leq Rc$, a few of abnormal grains naturally created in the polycrystals continuously grew into the polycrystalline bodies, thereby producing large single crystals. The size of fully grown-up single crystals was $20 \times 20$ mm$^2$ or more.

Measurements of Dielectric Characteristics and Phase Transition Temperatures

Dielectric characteristics and phase transition temperatures of the single crystal produced in the example 3-1 were measured according to an IEEE method by using an impedance analyser. The results thereof were shown in FIG. 9 and Table 7 below.

FIG. 9 is a graph showing dielectric characteristics and phase transition temperatures (Tc and $T_{RT}$) of the single crystal of $[Pb_{0.97}Sr_{0.03}][(Mg_{1/3}Nb_{2/3})_{0.4}Ti_{(0.6-y)}Zr_y]O_3$ ($0.19 \leq y \leq 0.31$) according to variation in temperature. Table 7 shows variations in characteristics of dielectric constant, phase transition temperatures, piezoelectric constant, and coercive field value of the produced single crystal according to change in y. As shown in FIG. 9 and Table 7, as y increased from 0.19 to 0.31, Tc maintained a substantially constant temperature on the order of 200° C. but $T_{RT}$ continuously increased from 100° C. to 165° C. When y was equal to 0.23, dielectric and piezoelectric characteristics had the maximum values, so that it could be known that the composition of MPB was approximately y=0.23. In Table 7, rhombohedral single crystals had a characteristic of <001> direction of cubic phase, and tetragonal single crystals had a characteristic of <011> direction.

TABLE 7

| | y = 0.19 | y = 0.21 | y = 0.23 | y = 0.25 | y = 0.27 | y = 0.29 | y = 0.31 |
|---|---|---|---|---|---|---|---|
| dielectric constant($K_3^T$) | 5,500 | 6,000 | 7,000 | 6,500 | 6,000 | 5,500 | 5,000 |
| Tc/$T_{RT}$[° C.] | 215/0 | 220/40 | 200/105 | 205/120 | 200/135 | 200/150 | 195/165 |
| $d_{33}$[pC/N] | 1,600 | 1,800 | 2,200 | 2,000 | 1,900 | 1,700 | 1,600 |
| $k_{33}$ | 0.86 | 0.89 | 0.92 | 0.92 | 0.90 | 0.89 | 0.88 |
| Ec [kV/cm] | 6.0 | 6.5 | 5.5 | 5.5 | 6 | 6 | 6.5 |

The single crystals produced in this Example had higher properties as the single crystal composition belonging to rhombohedral phase was closer to the MPB. As the composition varied from the MPB toward rhombohedral phase (as y increasing), the dielectric and piezoelectric characteristics decreased but, on the other hand, $T_{RT}$ phase transition temperature increased. As the composition varied from the MPB toward the tetragonal phase (as y decreasing), the dielectric and piezoelectric characteristics and $T_{RT}$ decreased. The piezoelectric single crystals having a Perovskite structure containing Zr, which is rhombohedral but closer to MPB composition, showed at a specific composition all of the following properties: dielectric constant of $K_3^T \geq 4,000$; piezoelectric constant of $d_{33} \geq 1,400$ pC/N and $k_{33} \geq 0.85$; phase transition temperatures of Tc$\geq$180° C. and $T_{RT} \geq$100° C.; and coercive field of Ec$\geq$5 kV/cm.

Example 4

In this Example, reinforced piezoelectric single crystals having a composition of $[Pb_{0.97}Sr_{0.03}][(Mg_{1/3}Nb_{2/3})_{0.4}Ti_{(0.6-y)}Zr_y]O_3+cP$ ($0.05 \leq y \leq 0.62$; $0.001 \leq c \leq 0.20$) were produced by adding reinforced secondary phases by the volume fraction from 0.1% to 20% into the compositions of $[Pb_{0.97}Sr_{0.03}][(Mg_{1/3}Nb_{2/3})_{0.4}Ti_{(0.6-y)}Zr_y]O_3$ ($0.05 \leq y \leq 0.62$), and variations in dielectric constant, piezoelectric constant, phase transition temperatures, coercive field value, and fracture strength according to change in kind and content of the reinforcing secondary phases were measured.

Production of Single Crystal

In order to produce piezoelectric single crystals having a Perovskite structure containing a secondary phase reinforcing agent, P (one or more selected from the group including Au, Ag, Pt, Pd, Rh, MgO, ZrO$_2$, and pores) was added by the volume fraction from 0.1% to 20% ($0.001 \leq c \leq 0.20$) into the piezoelectric ceramic powders having a Perovskite structure to produce polycrystals, and single crystals were produced by a solid-state single crystal growth method, using the produced polycrystals.

In this example, first, ceramics powders having a composition of $[Pb_{0.97}Sr_{0.03}][(Mg_{1/3}Nb_{2/3})_{0.4}Ti_{(0.6-y)}Zr_y]O_3$ ($0.05 \leq y \leq 0.62$) were produced according to the example 3, y values of the produced powders were set to 0.19, 0.21, 0.23, 0.25, 0.27, 0.29, and 0.31, respectively. To the produced Perovskite powders, ZrO$_2$ powders (P=ZrO$_2$), AgPd powders (P=AgPd), and carbon granules (P=pore) were respectively added, together with the overdose of PbO powders. Since the carbon granules were decomposed and eliminated during heat-treatment, pores were formed inside the polycrystals and single crystals. Resultant powder-molded bodies were heat-treated at several temperatures with an interval of 25° C. in the range from 900° C. to 1,300° C., for up to 100 hours. Through such heat-treatment, polycrystals having compositions of $[Pb_{0.97}Sr_{0.03}][(Mg_{1/3}Nb_{2/3})_{0.4}Ti_{(0.6-y)}Zr_y]O_3+cZrO_2$, $[Pb_{0.97}Sr_{0.03}][(Mg_{1/3}Nb_{2/3})_{0.4}Ti_{(0.6-y)}Zr_y]O_3+cAgPd$, and $[Pb_{0.97}Sr_{0.03}][(Mg_{1/3}Nb_{2/3})_{0.4}Ti_{(0.6-y)}Zr_y]O_3+c(Pore)$ ($0.25 \leq x \leq 0.58$; $0.05 \leq y \leq 0.62$; $0.001 \leq c \leq 0.20$) were produced. The production of the single crystals according to respective compositions was carried out by the same test conditions and method as in <example 3>, the growth rate of the single crystal having a secondary phase was lower than that of the single crystal not having the same, but the growing behavior and conditions thereof were similar to each other.

Measurement of Fracture Strength

The fracture strengths of the single crystals containing reinforcing secondary phases produced in example 4 were measured by 4-point bending test method according to an ASTM method.

The results thereof were shown in Tables 8a to 8c below.

TABLE 8a

| P = ZrO$_2$ [MPa] | c = 0.0 | c = 0.01 | c = 0.05 | c = 0.10 | c = 0.20 | c = 0.30 |
|---|---|---|---|---|---|---|
| y = 0.21 | 48 ± 15 | 52 ± 15 | 58 ± 15 | 55 ± 15 | 50 ± 15 | 40 ± 15 |
| y = 0.23 | 48 ± 15 | 52 ± 15 | 58 ± 15 | 55 ± 15 | 50 ± 15 | 40 ± 15 |
| y = 0.25 | 48 ± 15 | 52 ± 15 | 58 ± 15 | 55 ± 15 | 50 ± 15 | 40 ± 15 |

TABLE 8b

| P = AgPd [MPa] | c = 0.0 | c = 0.01 | c = 0.05 | c = 0.10 | c = 0.20 | c = 0.30 |
|---|---|---|---|---|---|---|
| y = 0.21 | 48 ± 15 | 53 ± 15 | 65 ± 15 | 68 ± 15 | 55 ± 15 | 45 ± 15 |
| y = 0.23 | 48 ± 15 | 53 ± 15 | 65 ± 15 | 68 ± 15 | 55 ± 15 | 45 ± 15 |
| y = 0.25 | 48 ± 15 | 53 ± 15 | 65 ± 15 | 68 ± 15 | 55 ± 15 | 45 ± 15 |

TABLE 8c

| P = Pore [MPa] | c = 0.0 | c = 0.01 | c = 0.05 | c = 0.10 | c = 0.20 | c = 0.30 |
|---|---|---|---|---|---|---|
| y = 0.21 | 48 ± 15 | 55 ± 15 | 58 ± 15 | 52 ± 15 | 50 ± 15 | 40 ± 15 |
| y = 0.23 | 48 ± 15 | 55 ± 15 | 58 ± 15 | 52 ± 15 | 50 ± 15 | 40 ± 15 |
| y = 0.25 | 48 ± 15 | 55 ± 15 | 58 ± 15 | 52 ± 15 | 50 ± 15 | 40 ± 15 |

As shown in Tables 8a-8c, the single crystals having a composition of $[Pb_{0.97}Sr_{0.03}][(Mg_{1/3}Nb_{2/3})_{0.4}Ti_{(0.6-y)}Zr_y]O_3$ ($0.05 \leq y \leq 0.62$) had similar fracture strengths of 48±15 MPa, irrespective of the variations in composition. The single crystals containing therein a reinforcing secondary phase, such as $ZrO_2$, AgPd, and pores, by volume fraction of 20% or less had increased fracture strengths, as compared to that not having the reinforcing secondary phase.

Measurement of Piezoelectric Characteristic

In the $[Pb_{0.97}Sr_{0.03}][(Mg_{1/3}Nb_{2/3})_{0.4}Ti_{(0.6-y)}Zr_y]O_3+cP$ ($0.05 \leq y \leq 0.62$; $0.001 \leq c \leq 0.20$) reinforced piezoelectric single crystals produced according to example 4, characteristics such as phase transition temperatures and piezoelectric constant according to change in y and c were measured according to an IEEE method by using an impedance analyser. Phase transition temperatures ($T_c$ and $T_{RT}$) of the single crystals produced were not substantially changed by addition of secondary phases. Further, when AgPd particles were added to $[Pb_{0.97}Sr_{0.03}][(Mg_{1/3}Nb_{2/3})_{0.4}Ti_{(0.6-y)}Zr_y]O_3$ (y=0.25) single crystals to increase a volume fraction thereof from 0% to 20%, variation in dielectric constant of the piezoelectric signal crystals was reported in Table 9.

TABLE 9

| y = 0.25 | |
|---|---|
| Volume Fraction of AgPd | Dielectric Constant ($K_3^T$) |
| 0.00 | 6,500 |
| 0.005 | 6,800 |
| 0.02 | 7,400 |
| 0.05 | 7,900 |
| 0.10 | 8,300 |
| 0.20 | 8,500 |

Analysis of Results

Characteristics of the single crystals produced in this example were improved in fracture strength and mechanical toughness thereof when the secondary phases such as $ZrO_2$, AgPd, and pores were added thereto in the range from 0.1% to 20% ($0.001 \leq c \leq 0.20$). Further, when AgPd particles that are conductive metal were scattered in the single crystals, a dielectric characteristic thereof were continuously increased in proportion to the content of AgPd particles. Thus, the piezoelectric single crystals having a Perovskite structure containing Zr, which includes secondary phases, such as $ZrO_2$, AgPd, and pores, showed at specific compositions all of the following properties: dielectric constant of $K_3^T \geq 4,000$; piezoelectric constant of $d_{33} \geq 1,400$ pC/N and $k_{33} \geq 0.85$; phase transition temperatures of $Tc \geq 180°$ C. and $T_{RT} \geq 100°$ C.; and coercive field of $Ec \geq 5$ kV/cm, and had improved mechanical properties, as compared to those not including the secondary phases.

Example 5

In this Example, single crystals having a composition of $[Pb][(Mg_{0.7}Zn_{0.3})_{1/3}Nb_{2/3})_{0.45}Ti_{(0.55-y)}Zr_y]O_3$ ($0.05 \leq y \leq 0.55$) were produced by a solid-state single crystal growth method, and variations in dielectric constant, piezoelectric constant, phase transition temperature and coercive field value according to change in Zr or $PbZrO_3$ content were measured.

Production of Single Crystal

In the Example, ceramic powders having compositions of $[Pb][(Mg_{0.7}Zn_{0.3})_{1/3}Nb_{2/3})_{0.45}Ti_{(0.55-y)}Zr_y]O_3$ ($0.05 \leq y \leq 0.55$) were prepared by using a columbite method, and y values were set to 0.20, 0.22, 0.24, 0.26, 0.28, and 0.30, respectively. First, MgO, ZnO, and $Nb_2O_5$ powders were mixed through ball milling and then calcined to produce $(Mg,Zn)Nb_2O_6$. PbO, $(Mg,Zn)Nb_2O_6$, $TiO_2$, and $ZrO_2$ powders were mixed and calcined to produce Perovskite powders. An overdose of PbO powder was added into the resultant $[Pb][((Mg_{0.7}Zn_{0.3})_{1/3}Nb_{2/3})_{0.45}Ti_{(0.55-y)}Zr_y]O_3$ powders while the amount of addition being varied into 0, 5, 10, 15, 20, 25, and 30 mol %, respectively, to thereby produce PbO-contained mixture-powders having several compositions. Powder-molded bodies were heat-treated at several temperatures with an interval of 25° C. in the range from 900° C. to 1,300° C., for up to 100 hours. As conditions for the average size R of polycrystalline matrix grains to be controlled in the range of 0.5 Rc $\leq$ R $\leq$ 2 Rc, the overdose of PbO addition was determined to be 15 mol %, and the heat-treatment temperature was determined to be 1,100° C. On the polycrystalline bodies produced as above, single crystal seeds of $Ba(Ti_{0.7}Zr_{0.3})O_3$ were placed, accompanied by heat-treatment. By using continuous growth of the single crystal seed into the polycrystalline, single crystals were produced with polycrystal compositions.

When the mean size R of the polycrystalline matrix grains was controlled to be in the range of 0.5 Rc $\leq$ R $\leq$ 2 Rc, the single crystal seed grew continuously into the polycrystalline molding. In the Example, when the overdose of PbO and the heat-treatment temperatures were adjusted to 15 mol % and 1100° C., respectively, it was possible to control the average size R of the polycrystalline matrix grains in the range of 0.5 Rc $\leq$ R $\leq$ 2 Rc. When the average size R of the polycrystalline matrix grains was controlled in the range of 0.5 Rc $\leq$ R $\leq$ 2 Rc, the single crystal seeds of $Ba(Ti_{0.7}Zr_{0.3})O_3$ continuously grew into the polycrystalline bodies of $[Pb][((Mg_{0.7}Zn_{0.3})_{1/3}Nb_{2/3})_{0.45}Ti_{(0.55-y)}Zr_y]O_3$ ($0.05 \leq y \leq 0.6$) during the heat-treatment, thereby producing single crystals with the same composition as the polycrystalline bodies. The size of fully grown-up single crystals was 25×25 mm² or more.

Measurement of Piezoelectric Characteristic

In the $[Pb][((Mg_{0.7}Zn_{0.3})_{1/3}Nb_{2/3})_{0.45}Ti_{(0.55-y)}Zr_y]O_3$ ($0.05 \leq y \leq 0.55$) single crystals produced according to example 5 above, variations in dielectric constant, phase transition temperature (Tc and $T_{RT}$), piezoelectric constant, and coercive field value according to change in y were measured according to an IEEE method by using an impedance analyser, and results are reported in Table 10 below.

TABLE 10

|  | y = 0.20 | y = 0.22 | y = 0.24 | y = 0.26 | y = 0.28 | y = 0.30 |
|---|---|---|---|---|---|---|
| Dielectric Constant ($K_3^T$) | 6,000 | 7,000 | 6,500 | 5,500 | 4,500 | 4,000 |
| Tc/$T_{RT}$ [° C.] | 255/100 | 250/115 | 250/130 | 260/145 | 255/160 | 255/175 |
| $d_{33}$ [pC/N] | 2,000 | 2,500 | 2,200 | 1,800 | 1,500 | 1,400 |
| $k_{33}$ | 0.89 | 0.95 | 0.93 | 0.90 | 0.87 | 0.85 |
| Ec [kV/cm] | 6.5 | 6.5 | 6 | 7.5 | 7 | 7 |

As seen in Table 10 above, as y in composition of [Pb][((Mg$_{0.7}$Zn$_{0.3}$)$_{1/3}$Nb$_{2/3}$)$_{0.45}$Ti$_{(0.55-y)}$Zr$_y$]O$_3$ (0.05≦y≦0.55) increased from 0.20 to 0.30, Tc maintained a constant temperature on the order of 250° C. but $T_{RT}$ continuously increased from 100° C. to 175° C.

The single crystals produced in this example had higher properties as the single crystal composition belonging to rhombohedral phase was closer to the MPB. As the composition varied from the MPB toward rhombohedral phase (as y increasing), the dielectric and piezoelectric characteristics decreased but, on the other hand, $T_{RT}$ increased. As the composition varied from the MPB toward the tetragonal phase (as y decreasing), the dielectric and piezoelectric characteristics and $T_{RT}$ decreased. The piezoelectric single crystals having a Perovskite structure containing Zr or PbZrO$_3$, which are rhombohedral but closer to MPB composition, showed at specific compositions all of the following properties: dielectric constant of $K_3^T$≧4,000; piezoelectric constant of $d_{33}$≧1,400 pC/N and $k_{33}$≧0.85; phase transition temperatures of Tc≧180° C. and $T_{RT}$≧100° C.; and coercive field of Ec≧5 kV/cm.

Example 6

In this Example, reinforced piezoelectric single crystals having a composition of [Pb][((Mg$_{0.7}$Zn$_{0.3}$)$_{1/3}$Nb$_{2/3}$)$_{0.45}$Ti$_{(0.55-y)}$Zr$_y$]O$_3$+cP (0.05≦y≦0.55; 0.001≦c≦0.20) were produced by adding reinforcing secondary phases by the volume fraction from 0.1% to 20% into the compositions of [Pb][((Mg$_{0.7}$Zn$_{0.3}$)$_{1/3}$Nb$_{2/3}$)$_{0.45}$Ti$_{(0.55-y)}$Zr$_y$]O$_3$ (0.05≦y≦0.55), and variations in dielectric constant, piezoelectric constant, phase transition temperatures, coercive field value, and fracture strength according to change in kind and content of the reinforcing secondary phases were measured.

Production of Single Crystal

In order to produce piezoelectric single crystals having a Perovskite structure containing a secondary phase reinforcing agent, P (one or more selected from the group including Au, Ag, Pt, Pd, Rh, MgO, ZrO$_2$, and pores) was added by volume fraction from 0.1% to 20% (0.001≦c≦0.20) into the piezoelectric ceramic powders having a Perovskite structure to produce polycrystals, and single crystals were produced by a solid-state single crystal growth method, using the produced polycrystals.

In this example, first, ceramics powders having a composition of [Pb][((Mg$_{0.7}$Zn$_{0.3}$)$_{1/3}$Nb$_{2/3}$)$_{0.45}$Ti$_{(0.55-y)}$Zr$_y$]O$_3$ (0.05≦y≦0.55) were produced according to the example 5, y values of the produced powders were set to 0.20, 0.22, 0.24, 0.26, 0.28, and 0.30, respectively. To the produced [Pb][((Mg$_{0.7}$Zn$_{0.3}$)$_{1/3}$Nb$_{2/3}$)$_{0.45}$Ti$_{(0.55-y)}$Zr$_y$]O$_3$ powders, MgO powders (P=MgO), Ag powders (P=Ag), PMMA polymer (P=pore) were respectively added, together with the overdose of PbO powders. Resultant powder-molded bodies were heat-treated at several temperatures with an interval of 25° C. in the range from 900° C. to 1,300° C., for up to 100 hours. Through such heat-treatment, polycrystals having compositions of [Pb][((Mg$_{0.7}$Zn$_{0.3}$)$_{1/3}$Nb$_{2/3}$)$_{0.45}$Ti$_{(0.55-y)}$Zr$_y$]O$_3$+cMgO, [Pb][((Mg$_{0.7}$Zn$_{0.3}$)$_{1/3}$Nb$_{2/3}$)$_{0.45}$Ti$_{(0.55-y)}$Zr$_y$]O$_3$+cAg, and [Pb][((Mg$_{0.7}$Zn$_{0.3}$)$_{1/3}$Nb$_{2/3}$)$_{0.45}$Ti$_{(0.55-y)}$Zr$_y$]O$_3$+c(Pore) (0.05≦y≦0.55; 0.001≦c≦0.20) were produced. The production of the single crystals according to respective compositions was carried out by the same test conditions and method as in <example 5>, the growth rate of the single crystal having a secondary phase was lower than that of the single crystal not having the same, but the growth behavior and conditions thereof were similar to each other.

Measurement of Fracture Strength

The fracture strengths of the single crystals containing reinforcing secondary phases produced in example 6 were measured by 4-point bending test method according to an ASTM method.

The results thereof were shown in Tables 11a to 11c below.

TABLE 11a

| P = MgO [MPa] | c = 0.0 | c = 0.01 | c = 0.05 | c = 0.10 | c = 0.20 | c = 0.30 |
|---|---|---|---|---|---|---|
| y = 0.22 | 46 ± 12 | 49 ± 12 | 53 ± 12 | 51 ± 12 | 48 ± 12 | 38 ± 12 |
| y = 0.24 | 46 ± 12 | 49 ± 12 | 53 ± 12 | 51 ± 12 | 48 ± 12 | 38 ± 12 |
| y = 0.26 | 46 ± 12 | 49 ± 12 | 53 ± 12 | 51 ± 12 | 48 ± 12 | 38 ± 12 |

TABLE 11b

| P = Ag [MPa] | c = 0.0 | c = 0.01 | c = 0.05 | c = 0.10 | c = 0.20 | c = 0.30 |
|---|---|---|---|---|---|---|
| y = 0.22 | 46 ± 12 | 49 ± 12 | 52 ± 12 | 57 ± 12 | 55 ± 12 | 41 ± 12 |
| y = 0.24 | 46 ± 12 | 49 ± 12 | 52 ± 12 | 57 ± 12 | 55 ± 12 | 41 ± 12 |
| y = 0.26 | 46 ± 12 | 49 ± 12 | 52 ± 12 | 57 ± 12 | 55 ± 12 | 41 ± 12 |

TABLE 11c

| P = Pore [MPa] | c = 0.0 | c = 0.01 | c = 0.05 | c = 0.10 | c = 0.20 | c = 0.30 |
|---|---|---|---|---|---|---|
| y = 0.22 | 46 ± 12 | 50 ± 12 | 55 ± 12 | 50 ± 12 | 47 ± 12 | 34 ± 12 |
| y = 0.24 | 46 ± 12 | 50 ± 12 | 55 ± 12 | 50 ± 12 | 47 ± 12 | 34 ± 12 |
| y = 0.25 | 46 ± 12 | 50 ± 12 | 55 ± 12 | 50 ± 12 | 47 ± 12 | 34 ± 12 |

As shown in Tables 11a-11c, the single crystals having a composition of [Pb][((Mg$_{0.7}$Zn$_{0.3}$)$_{1/3}$Nb$_{2/3}$)$_{0.45}$Ti$_{(0.55-y)}$Zr$_y$]O$_3$ (0.05≦y≦0.55) had similar fracture strengths of 46±12 MPa, irrespective of the variations in composition. The single crystals containing therein a reinforcing secondary phase, such as MgO, Ag, and pores, by volume fraction of 20% or less had increased fracture strengths, as compared to that not having the reinforcing secondary phase.

Measurement of Piezoelectric Characteristic

In the [Pb][((Mg$_{0.7}$Zn$_{0.3}$)$_{1/3}$Nb$_{2/3}$)$_{0.45}$Ti$_{(0.55-y)}$Zr$_y$]O$_3$+cP (0.05≦y≦0.55; 0.001≦c≦0.20) reinforced piezoelectric single crystals produced according to example 6, characteristics such as phase transition temperatures and piezoelectric constant according to change in y and c were measured according to an IEEE method by using an impedance analyser. Phase transition temperatures (Tc and $T_{RT}$) of the single crystals produced were not substantially changed by addition of secondary phases. Further, when Ag particles were added to $[Pb][((Mg_{0.7}Zn_{0.3})_{1/3}Nb_{2/3})_{0.45}Ti_{(0.55-y)}Zr_y]O_3$ (y=0.24) single crystals to increase a volume fraction thereof from 0% to 20%, variation in dielectric constant of the piezoelectric signal crystals was reported in Table 12.

TABLE 12 y = 0.24

| Volume Fraction of Ag | Dielectric Constant ($K_3^T$) |
|---|---|
| 0.00 | 6,500 |
| 0.005 | 6,800 |
| 0.02 | 7,200 |
| 0.05 | 7,600 |
| 0.10 | 8,000 |
| 0.20 | 8,200 |

Analysis of Results

Characteristics of the single crystals produced in this example were improved in fracture strength and mechanical toughness thereof when the secondary phases such as MgO, Ag, and pores were added thereto in the range from 0.1% to 20% ($0.001 \leq c \leq 0.20$). Further, when Ag particles that are conductive metal were scattered in the single crystals, a dielectric characteristic thereof were continuously increased. Thus, the piezoelectric single crystals having a Perovskite structure containing Zr, which includes secondary phases, such as MgO, Ag, and pores, showed at specific compositions all of the following properties: dielectric constant of $K_3^T \geq 4,000$; piezoelectric constant of $d_{33} \geq 1,400$ pC/N and $k_{33} \geq 0.85$; phase transition temperatures of $Tc \geq 180°$ C. and $T_{RT} \geq 100°$ C.; and coercive field of $Ec \geq 5$ kV/cm, and had improved mechanical properties, as compared to those not including the secondary phases.

Example 7

In this Example, single crystals having a composition of $[Pb][((Mg_{1/3}Nb_{2/3})_{0.1}(In_{1/2}Nb_{1/2})_{0.1}Ti_{(0.8-y)}Zr_y]O_3$ ($0.05 \leq y \leq 0.62$) were produced by a solid-state single crystal growth method, and variations in dielectric constant, piezoelectric constant, phase transition temperature and coercive field value according to change in Zr or PbZrO$_3$ content were measured.

Production of Single Crystal

In the Example, ceramic powders having compositions of $[Pb][((Mg_{1/3}Nb_{2/3})_{0.1}(In_{1/2}Nb_{1/2})_{0.1}Ti_{(0.8-y)}Zr_y]O_3$ ($0.05 \leq y \leq 0.62$) were prepared by using a columbite method. First, MgO, In$_2$O$_3$, and Nb$_2$O$_5$ powders were mixed through ball milling and then calcined to produce a (Mg,In)Nb$_2$O$_6$ phase, and PbO, (Mg,In)Nb$_2$O$_6$, TiO$_2$, and ZrO$_2$ powders were mixed and calcined to produce Perovskite powders, and y values were set to 0.35, 0.37, 0.39, 0.41, 0.43, and 0.45, respectively. An overdose of PbO was added into the produced Perovskite powders while the amount of addition being varied into 0, 5, 10, 15, 20, 25, and 30 mol %, respectively, to thereby produce PbO-contained mixture-powders having several compositions. Powder-molded bodies were heat-treated at several temperatures with an interval of 25° C. in the range from 900° C. to 1,300° C., for up to 100 hours. As conditions for the average size R of polycrystalline matrix grains to be controlled in the range of 0.5 Rc$\leq$R$\leq$2 Rc, where Rc is the critical size at which an abnormal grain growth starts to occur, the overdose of PbO addition was determined to be 25 mol %, and the heat-treatment temperature was determined to be 1,200° C. On the polycrystalline bodies produced as above, single crystal seeds of Ba(Ti$_{0.7}$Zr$_{0.3}$)O$_3$ were placed, accompanied by heat-treatment. That is, after 25 mol % overdose of PbO was added to the produced powders, accompanied by heat-treatment at 1200° C. to thereby produce the polycrystals, when single crystal seeds of Ba(Ti$_{0.7}$Zr$_{0.3}$)O$_3$ were placed on the produced polycrystals, accompanied by heat-treatment at 1200° C. for 300 hours, the single crystal seed continuously grew so that single crystals grew in the polycrystals while having polycrystal compositions.

When the mean size R of the polycrystalline matrix grains was controlled to be in the range of 0.5 Rc$\leq$R$\leq$2 Rc, the single crystal seed grew continuously into the polycrystalline molding. In the Example, when the overdose of PbO and the heat-treatment temperatures were adjusted, it was possible to control the average size R of the polycrystalline matrix grains in the range of 0.5 Rc$\leq$R$\leq$2 Rc. When the average size R of the polycrystalline matrix grains was controlled in the range of 0.5 Rc$\leq$R$\leq$2 Rc, the single crystal seeds of Ba(Ti$_{0.7}$Zr$_{0.3}$)O$_3$ continuously grew into the polycrystalline bodies during the heat-treatment, thereby producing single crystals with the same composition as the polycrystalline bodies. The size of fully grown-up single crystals was 25×25 mm$^2$ or more.

Measurement of Piezoelectric Characteristic

In the $[Pb][((Mg_{1/3}Nb_{2/3})_{0.1}(In_{1/2}Nb_{1/2})_{0.1}Ti_{(0.8-y)}Zr_y]O_3$ ($0.05 \leq y \leq 0.62$) single crystals produced according to above example 7, variations in dielectric constant, phase transition temperature (Tc and $T_{RT}$), piezoelectric constant, and coercive field value according to change in y were measured according to an IEEE method by using an impedance analyser, and results are reported in Table 13 below.

TABLE 13

| | y = 0.35 | y = 0.37 | y = 0.39 | y = 0.41 | y = 0.43 | y = 0.45 |
|---|---|---|---|---|---|---|
| Dielectric Constant ($K_3^T$) | 5,000 | 6,000 | 5,500 | 5,000 | 4,500 | 4,000 |
| Tc/$T_{RT}$ [° C.] | 300/100 | 305/105 | 300/135 | 300/160 | 295/180 | 300/195 |
| $d_{33}$ [pC/N] | 1,700 | 2,300 | 2,000 | 1,750 | 1,600 | 1,450 |
| $k_{33}$ | 0.87 | 0.94 | 0.91 | 0.90 | 0.88 | 0.86 |
| Ec [kV/cm] | 8 | 8.5 | 8 | 8 | 7.5 | 8 |

As seen in Table 13 above, as y in composition of $[Pb][((Mg_{1/3}Nb_{2/3})_{0.1}(In_{1/2}Nb_{1/2})_{0.1}Ti_{(0.8-y)}Zr_y]O_3$ ($0.05 \leq y \leq 0.62$) increased from 0.35 to 0.45, Tc maintained a constant temperature on the order of 300° C. but $T_{RT}$ continuously increased from 100° C. to 195° C.

The single crystals produced in this example had higher properties as the single crystal composition belonging to rhombohedral phase was closer to the MPB. As the composition was far away from the MPB, the dielectric and piezoelectric characteristics decreased but, on the other hand, $T_{RT}$ increased. The piezoelectric single crystals having a Perovskite structure containing Zr or $PbZrO_3$, which are rhombohedral but closer to MPB composition, showed at specific compositions all of the following properties: dielectric constant of $K_3^T \geq 4{,}000$; piezoelectric constant of $d_{33} \geq 1{,}400$ pC/N and $k_{33} \geq 0.85$; phase transition temperatures of $Tc \geq 180°$ C. and $T_{RT} \geq 100°$ C.; and coercive field of $Ec \geq 5$ kV/cm.

Example 8

In this Example, reinforced piezoelectric single crystals having a composition of $[Pb][((Mg_{1/3}Nb_{2/3})_{0.1}(In_{1/2}Nb_{1/2})_{0.1}Ti_{(0.8-y)}Zr_y]O_3+cP$ ($0.05 \leq y \leq 0.62$; $0.001 \leq c \leq 0.20$) were produced by adding reinforcing secondary phases by the volume fraction from 0.1% to 20% into the compositions of the example 7 of $[Pb][((Mg_{1/3}Nb_{2/3})_{0.1}(In_{1/2}Nb_{1/2})_{0.1}Ti_{(0.8-y)}Zr_y]O_3$ ($0.05 \leq y \leq 0.62$), and variations in dielectric constant, piezoelectric constant, phase transition temperatures, coercive field value, and fracture strength according to change in kind and content of the reinforcing secondary phases were measured.

Production of Single Crystal

In order to produce piezoelectric single crystals having a Perovskite-type crystal structure containing a secondary phase reinforcing agent, P (one or more selected from the group including Au, Ag, Pt, Pd, Rh, MgO, $ZrO_2$, and pores) was added by volume fraction from 0.1% to 20% ($0.001 \leq c \leq 0.20$) into the piezoelectric ceramic powders having a Perovskite structure to produce polycrystals, and single crystals were produced by a solid-state single crystal growth method, using the produced polycrystals.

In this example, first, ceramics powders having a composition of $[Pb][((Mg_{1/3}Nb_{2/3})_{0.1}(In_{1/2}Nb_{1/2})_{0.1}Ti_{(0.8-y)}Zr_y]O_3$ ($0.05 \leq y \leq 0.62$) were produced according to the example 7, and y values of the produced powders were set to 0.35, 0.37, 0.39, 0.41, 0.43, and 0.45, respectively. To the produced Perovskite powders, $ZrO_2$ powders ($P=ZrO_2$), Rh powders (P=Rh), and PMMA polymer (P=pore) were respectively added, together with the overdose of PbO powders. Resultant powder-molded bodies were heat-treated at several temperatures with an interval of 25° C. in the range from 900° C. to 1,300° C., for up to 100 hours. Through such heat-treatment, polycrystals having compositions of $[Pb][((Mg_{1/3}Nb_{2/3})_{0.1}(In_{1/2}Nb_{1/2})_{0.1}Ti_{(0.8-y)}Zr_y]O_3+cZrO_2$, $[Pb][((Mg_{1/3}Nb_{2/3})_{0.1}(In_{1/2}Nb_{1/2})_{0.1}Ti_{(0.8-y)}Zr_y]O_3+cRh$, and $[Pb][((Mg_{1/3}Nb_{2/3})_{0.1}(In_{1/2}Nb_{1/2})_{0.1}Ti_{(0.8-y)}Zr_y]O_3+c(Pore)$ ($0.05 \leq y \leq 0.62$; $0.001 \leq c \leq 0.20$) were produced. The production of the single crystals according to respective compositions was carried out by the same test conditions and method as in <example 7>, the growth rate of the single crystal having a secondary phase was lower than that of the single crystal not having the same, but the growing behavior and conditions thereof were similar to each other.

Measurement of Fracture Strength

The fracture strengths of the single crystals containing reinforcing secondary phases produced according to example 8 were measured by 4-point bending test method according to an ASTM method. The results thereof were shown in Tables 14a to 14c below.

TABLE 14a

| P = $ZrO_2$ [MPa] | c = 0.0 | c = 0.01 | c = 0.05 | c = 0.10 | c = 0.20 | c = 0.30 |
|---|---|---|---|---|---|---|
| y = 0.37 | 50 ± 13 | 52 ± 13 | 58 ± 13 | 65 ± 13 | 60 ± 13 | 40 ± 13 |
| y = 0.39 | 50 ± 13 | 52 ± 13 | 58 ± 13 | 65 ± 13 | 60 ± 13 | 40 ± 13 |
| y = 0.41 | 50 ± 13 | 52 ± 13 | 58 ± 13 | 65 ± 13 | 60 ± 13 | 40 ± 13 |

TABLE 14b

| P = Rh [MPa] | c = 0.0 | c = 0.01 | c = 0.05 | c = 0.10 | c = 0.20 | c = 0.30 |
|---|---|---|---|---|---|---|
| y = 0.37 | 50 ± 13 | 53 ± 13 | 60 ± 13 | 67 ± 13 | 63 ± 13 | 44 ± 13 |
| y = 0.39 | 50 ± 13 | 53 ± 13 | 60 ± 13 | 67 ± 13 | 63 ± 13 | 44 ± 13 |
| y = 0.41 | 50 ± 13 | 53 ± 13 | 60 ± 13 | 67 ± 13 | 63 ± 13 | 44 ± 13 |

TABLE 14c

| P = Pore [MPa] | c = 0.0 | c = 0.01 | c = 0.05 | c = 0.10 | c = 0.20 | c = 0.30 |
|---|---|---|---|---|---|---|
| y = 0.37 | 50 ± 13 | 52 ± 13 | 58 ± 13 | 55 ± 13 | 52 ± 13 | 42 ± 13 |
| y = 0.39 | 50 ± 13 | 52 ± 13 | 58 ± 13 | 55 ± 13 | 52 ± 13 | 42 ± 13 |
| y = 0.41 | 50 ± 13 | 52 ± 13 | 58 ± 13 | 55 ± 13 | 52 ± 13 | 42 ± 13 |

As shown in Tables 14a-14c, the single crystals having a composition of $[Pb][((Mg_{1/3}Nb_{2/3})_{0.1}(In_{1/2}Nb_{1/2})_{0.1}Ti_{(0.8-y)}Zr_y]O_3$ ($0.05 \leq y \leq 0.62$) had similar fracture strengths of 50±13 MPa, irrespective of the variations in composition. The single crystals containing therein a reinforcing secondary phase, such as $ZrO_2$, Rh, and pores, by volume fraction of 20% or less had increased fracture strengths, as compared to that not having the reinforcing secondary phase.

Measurement of Piezoelectric Characteristic

In the $[Pb][((Mg_{1/3}Nb_{2/3})_{0.1}(In_{1/2}Nb_{1/2})_{0.1}Ti_{(0.8-y)}Zr_y]O_3+cP$ ($0.05 \leq y \leq 0.62$; $0.001 \leq c \leq 0.20$) reinforced piezoelectric single crystals produced according to example 8, characteristics such as phase transition temperatures and piezoelectric constant according to change in y and c were measured according to an IEEE method by using an impedance analyser. Phase transition temperatures (Tc and $T_{RT}$) of the single crystals produced were not substantially changed by addition of secondary phases. Further, when Rh particles were added to $[Pb][((Mg_{1/3}Nb_{2/3})_{0.1}(In_{1/2}Nb_{1/2})_{0.1}Ti_{(0.8-y)}Zr_y]O_3$ (y=0.37) single crystals to increase a volume fraction thereof from 0% to 20%, variation in dielectric constant of the piezoelectric signal crystals was reported in Table 15.

TABLE 15

| y = 0.37 | |
|---|---|
| Volume Fraction of Rh | Dielectric Constant ($K_3^T$) |
| 0.00 | 6,000 |
| 0.005 | 6,300 |
| 0.02 | 6,700 |
| 0.05 | 7,100 |
| 0.10 | 7,400 |
| 0.20 | 7,600 |

Analysis of Results

Characteristics of the single crystals produced in this example were improved in fracture strength and mechanical toughness thereof when the secondary phases such as $ZrO_2$, Rh, and pores were added thereto in the range from 0.1% to 20% ($0.001 \leq c \leq 0.20$). Further, when Rh particles that are conductive metal were scattered in the single crystals, a dielectric characteristic thereof were continuously increased. Thus, the piezoelectric single crystals having a Perovskite structure containing Zr, which includes secondary phases, such as $ZrO_2$, Rh, and pores, showed at specific compositions all of the following properties: dielectric constant of $K_3^T \geq 4{,}000$; piezoelectric constant of $d_{33} \geq 1{,}400$ pC/N and $k_{33} \geq 0.85$; phase transition temperatures of $Tc \geq 180°$ C. and $T_{RT} \geq 100°$ C.; and coercive field of $Ec \geq 5$ kV/cm, and had improved mechanical properties, as compared to those not including the secondary phases.

Example 9

In this Example, lead-free single crystals having a composition of $[Ba_xBi_{(1-x)}Ti_{(x-y)}Zr_y]O_3$ ($0.65 \leq x \leq 1.00$; $0.05 \leq y \leq 0.15$) were produced by a solid-state single crystal growth method, and variations in dielectric constant, piezoelectric constant, phase transition temperature and coercive field value according to change in Zr content were measured.

Production of Single Crystal

In the Example, single crystals were grown from ceramic powder having a composition of $[Ba_xBi_{(1-x)}][Fe_{(1-x)}Ti_{(x-y)}Zr_y]O_3$ ($0.65 \leq x \leq 1.00$; $0.05 \leq y \leq 0.15$) by using a solid-state single crystal growth method. $BaCO_3$, $Bi_2O_3$, $Fe_2O_3$, $TiO_2$, $ZrO_2$ powders were mixed through ball milling and then calcined to produce Perovskite powders, and x value was set to 0.75, and y values were set to 0.05, 0.07, 0.09, 0.11, and 0.13, respectively. Overdoses of $TiO_2$, $Bi_2O_3$ powders were added into the $[Ba_xBi_{(1-x)}][Fe_{(1-x)}Ti_{(x-y)}Zr_y]O_3$ ($0.65 \leq x \leq 1.00$; $0.05 \leq y \leq 0.15$) powders while the amount of addition being varied from 0 to 15 mol %, to thereby produce $TiO_2$ and $Bi_2O_3$ contained mixture-powders having several compositions. The resultant mixture-powders were formed and then pressed at a hydrostatic pressure of 200 MPa. The powder-molded bodies were heat-treated at several temperatures with an interval of 25° C. in the range from 800° C. to 1,350° C., for up to 100 hours. As conditions for the average size R of polycrystalline matrix grains to be controlled in the range of $0.5 \, Rc \leq R \leq 2 \, Rc$, the overdoses of $TiO_2$ and $Bi_2O_3$ addition were determined to be 0.5 and 2.0 mol %, respectively, and the heat-treatment temperature was determined to be 1,100° C. On the polycrystalline bodies produced as above, single crystal seeds of $Ba(Ti_{0.7}Zr_{0.3})O_3$ were placed, accompanied by heat-treatment. When heat-treated for up to 300 hours, the single crystal seed continuously grew so that single crystals grew in the polycrystals while having polycrystal compositions.

When the mean size R of the polycrystalline matrix grains was controlled to be in the range of $0.5 \, Rc \leq R \leq 2 \, Rc$, where Rc is the critical size at which an abnormal grain growth starts to occur, the single crystal seed grew continuously into the polycrystalline molding. In the Example, when the overdoses of $TiO_2$ and $Bi_2O_3$, and the heat-treatment temperatures were adjusted, it was possible to control the average size R of the polycrystalline matrix grains in the range of $0.5 \, Rc \leq R \leq 2 \, Rc$. When the average size R of the polycrystalline matrix grains was controlled in the range of $0.5 \, Rc \leq R \leq 2 \, Rc$, the single crystal seeds of $Ba(Ti_{0.9}Zr_{0.1})O_3$ continuously grew into the polycrystalline bodies of $[Ba_xBi_{(1-x)}][Fe_{(1-x)}Ti_{(x-y)}Zr_y]O_3$ ($0.65 \leq x \leq 1.00$; $0.05 \leq y \leq 0.15$) during the heat-treatment, thereby producing single crystals with the same composition as the polycrystalline bodies. The size of fully grown-up single crystals was $15 \times 15$ mm² or more.

Measurement of Piezoelectric Characteristic

In the $[Ba_xBi_{(1-x)}][Fe_{(1-x)}Ti_{(x-y)}Zr_y]O_3$ ($0.65 \leq x \leq 1.00$; $0.05 \leq y \leq 0.15$) single crystals produced according to above example 9, variations in dielectric constant, phase transition temperature (Tc and $T_{RT}$), piezoelectric constant, and coercive field value according to change in y were measured according to an IEEE method by using an impedance analyser, and results are reported in Table 16 below.

TABLE 16

| x = 0.75 | y = 0.05 | y = 0.07 | y = 0.09 | y = 0.11 | y = 0.13 |
|---|---|---|---|---|---|
| Dielectric Constant ($K_3^T$) | 4,200 | 5,000 | 4,500 | 4,200 | 4,500 |
| Tc/$T_{RT}$ [° C.] | 250/100 | 245/120 | 250/140 | 240/150 | 230/160 |
| $d_{33}$ [pC/N] | 1,450 | 2,000 | 1,850 | 1,600 | 1,450 |
| $k_{33}$ | 0.85 | 0.91 | 0.88 | 0.87 | 0.85 |
| Ec [kV/cm] | 10 | 9.5 | 10 | 8.5 | 7.5 |

As seen in Table 16 above, as y in composition of $[Ba_xBi_{(1-x)}][Fe_{(1-x)}Ti_{(x-y)}Zr_y]O_3$ ($0.65 \leq x \leq 1.00$; $0.05 \leq y \leq 0.15$) increased from 0.05 to 0.15, Tc maintained a constant temperature on the order of 250° C. but $T_{RT}$ continuously increased from 100° C. to 160° C.

The single crystals produced in this example had higher properties as the single crystal composition belonging to rhombohedral phase was closer to the MPB. As the composition was far away from the MPB, the dielectric and piezoelectric characteristics decreased but, on the other hand, $T_{RT}$ phase transition temperature increased. The lead-free piezoelectric single crystals having a Perovskite structure containing Zr, which are rhombohedral but closer to MPB composition, showed at specific compositions all of the following properties: dielectric constant of $K_3^T \geq 4,000$; piezoelectric constant of $d_{33} \geq 1,400$ pC/N and $k_{33} \geq 0.85$; phase transition temperatures of $Tc \geq 180$° C. and $T_{RT} \geq 100$° C.; and coercive field of $Ec \geq 5$ kV/cm

Example 10

In this Example, reinforced piezoelectric single crystals having compositions of $[Ba_xBi_{(1-x)}][Fe_{(1-x)}Ti_{(x-y)}Zr_y]O_3+cP$ ($0.65 \leq x \leq 1.00$; $0.05 \leq y \leq 0.15$; $0.001 \leq c \leq 0.20$) were produced by adding reinforcing secondary phases by the volume fraction from 0.1% to 20% into the compositions of the example 9 of $[Ba_xBi_{(1-x)}][Fe_{(1-x)}Ti_{(x-y)}Zr_y]O_3$ ($0.65 \leq x \leq 1.00$; $0.05 \leq y \leq 0.15$), and variations in dielectric constant, piezoelectric constant, phase transition temperatures, coercive field value, and fracture strength according to change in kind and content of the reinforcing secondary phases were measured.

Production of Single Crystal

In order to produce lead-free piezoelectric single crystals having a Perovskite structure containing a secondary phase reinforcing agent, P (one or more selected from the group including Au, Ag, Pt, Pd, Rh, MgO, $ZrO_2$, and pores) was added by volume fraction from 0.1% to 20% ($0.001 \leq c \leq 0.20$) into the ceramic powders to produce polycrystals, and single crystals were produced by a solid-state single crystal growth method, using the produced polycrystals. In this example, first, ceramics powders having a composition of $[Ba_xBi_{(1-x)}][Fe_{(1-x)}Ti_{(x-y)}Zr_y]O_3$ ($0.65 \leq x \leq 1.00$; $0.05 \leq y \leq 0.15$) were produced according to the example 9, and x value was set to 0.75, and y values were set to 0.05, 0.07, 0.09, 0.11, and 0.13, respectively. To the produced powders of $[Ba_xBi_{(1-x)}][Fe_{(1-x)}Ti_{(x-y)}Zr_y]O_3$, MgO powders (P=MgO), Pt powders (P=Pt), and PMMA polymer (P=pore) were respectively added, together with the overdoses of $TiO_2$ and $Bi_2O_3$ powders. The resultant mixture-powders were formed and then pressed at a hydrostatic pressure of 200 MPa. Resultant powder-molded bodies were heat-treated at several temperatures with an interval of 25° C. in the range from 800° C. to 1,350° C., for up to 100 hours. Through such heat-treatment, polycrystals having compositions of $[Ba_xBi_{(1-x)}]$ $[Fe_{(1-x)}Ti_{(x-y)}Zr_y]O_3+cMgO$, $[Ba_xBi_{(1-x)}][Fe_{(1-x)}Ti_{(x-y)}Zr_y]O_3+cPt$, and $[Ba_xBi_{(1-x)}][Fe_{(1-x)}Ti_{(x-y)}Zr_y]O_3+c(Pore)$ ($0.65 \leq x \leq 1.00$; $0.05 \leq y \leq 0.15$; $0.001 \leq c \leq 0.20$) were produced. The production of the single crystals according to respective compositions was carried out by the same test conditions and method as in <example 9>, the growth rate of the single crystal having a secondary phase was lower than that of the single crystal not having the same, but the growing behavior and conditions thereof were similar to each other.

Measurement of Fracture Strength

The fracture strengths of the single crystals containing reinforcing secondary phases produced according to example 10 were measured by 4-point bending test method according to an ASTM method. The results thereof were shown in Tables 17a to 17c below.

TABLE 17a

| P = MgO [MPa] | c = 0.0 | c = 0.01 | c = 0.05 | c = 0.10 | c = 0.20 | c = 0.30 |
|---|---|---|---|---|---|---|
| y = 0.07 | 60 ± 15 | 63 ± 15 | 70 ± 15 | 80 ± 15 | 70 ± 15 | 55 ± 15 |
| y = 0.09 | 60 ± 15 | 63 ± 15 | 70 ± 15 | 80 ± 15 | 70 ± 15 | 55 ± 15 |
| y = 0.11 | 60 ± 15 | 63 ± 15 | 70 ± 15 | 80 ± 15 | 70 ± 15 | 55 ± 15 |

TABLE 17b

| P = Pt [MPa] | c = 0.0 | c = 0.01 | c = 0.05 | c = 0.10 | c = 0.20 | c = 0.30 |
|---|---|---|---|---|---|---|
| y = 0.07 | 60 ± 15 | 62 ± 15 | 68 ± 15 | 76 ± 15 | 72 ± 15 | 54 ± 15 |
| y = 0.09 | 60 ± 15 | 62 ± 15 | 68 ± 15 | 76 ± 15 | 72 ± 15 | 54 ± 15 |
| y = 0.11 | 60 ± 15 | 62 ± 15 | 68 ± 15 | 76 ± 15 | 72 ± 15 | 54 ± 15 |

TABLE 17c

| P = Pore [MPa] | c = 0.0 | c = 0.01 | c = 0.05 | c = 0.10 | c = 0.20 | c = 0.30 |
|---|---|---|---|---|---|---|
| y = 0.07 | 60 ± 15 | 62 ± 15 | 66 ± 15 | 65 ± 15 | 62 ± 15 | 48 ± 15 |
| y = 0.09 | 60 ± 15 | 62 ± 15 | 66 ± 15 | 65 ± 15 | 62 ± 15 | 48 ± 15 |
| y = 0.11 | 60 ± 15 | 62 ± 15 | 66 ± 15 | 65 ± 15 | 62 ± 15 | 48 ± 15 |

As shown in Tables 17a-17c, the single crystals having a composition of $[Ba_xBi_{(1-x)}][Fe_{(1-x)}Ti_{(x-y)}Zr_y]O_3$ ($0.65 \leq x \leq 1.00$; $0.05 \leq y \leq 0.15$) had similar fracture strengths of 60±15 MPa, irrespective of the variations in composition. The single crystals containing therein a reinforcing secondary phase, such as MgO, Pt, and pores, by volume fraction of 20% or less had increased fracture strengths, as compared to that not having the reinforcing secondary phase.

Measurement of Piezoelectric Characteristic

In the $[Ba_xBi_{(1-x)}][Fe_{(1-x)}Ti_{(x-y)}Zr_y]O_3+cP$ ($0.65 \leq x \leq 1.00$; $0.05 \leq y \leq 0.15$; $0.001 \leq c \leq 0.20$) reinforced piezoelectric single crystals produced according to example 10, characteristics such as phase transition temperatures and piezoelectric constant according to change in y and c were measured according to an IEEE method by using an impedance analyser. Phase transition temperatures (Tc and $T_{RT}$) of the single crystals produced were not substantially changed by addition of secondary phases. Further, when Pt particles were added to $[Ba_xBi_{(1-x)}][Fe_{(1-x)}Ti_{(x-y)}Zr_y]O_3$ (x=0.75; y=0.09) single crystals to increase a volume fraction thereof from 0% to 20%, variation in dielectric constant of the piezoelectric signal crystals was reported in Table 18.

TABLE 18 x = 0.75; y = 0.09

| Volume Fraction of Pt | Dielectric Constant ($K_3^T$) |
|---|---|
| 0.00 | 4,500 |
| 0.005 | 4,900 |
| 0.02 | 5,600 |
| 0.05 | 5,900 |
| 0.10 | 6,500 |
| 0.20 | 7,200 |

Analysis of Results

Characteristics of the single crystals produced in this example were improved in fracture strength and mechanical toughness thereof when the secondary phases such as MgO, Pt, and pores were added thereto in the range from 0.1% to 20% ($0.001 \leq c \leq 0.20$). Further, when Pt particles that are conductive metal were scattered in the single crystals, a dielectric characteristic thereof were continuously increased. Thus, the lead-free piezoelectric single crystals having a Perovskite structure containing Zr, which includes secondary phases, such as MgO, Pt, and pores, showed at specific compositions all of the following properties: dielectric constant of $K_3^T \geq 4,000$; piezoelectric constant of $d_{33} \geq 1,400$ pC/N and $k_{33} \geq 0.85$; phase transition temperatures of Tc≥180° C. and $T_{RT} \geq 100°$ C.; and coercive field of Ec≥5 kV/cm, and had improved mechanical properties, as compared to those not including the secondary phases.

INDUSTRIAL APPLICABILITY

The piezoelectric single crystals and piezoelectric single crystal application parts of the invention have all of high dielectric constant $K_3^T$, high piezoelectric constants ($d_{33}$ and $k_{33}$), high phase transition temperatures (Tc and $T_{RT}$), high coercive electric field Ec and improved mechanical properties and thus can be used in high temperature ranges and high voltage conditions.

Furthermore, the piezoelectric single crystals are produced by the solid-state single crystal growth method adequate for mass production of single crystals and the single crystal composition is developed not to contain expensive raw materials so that the piezoelectric single crystals can be easily commercialized. With the piezoelectric single crystals and piezoelectric single crystal application parts of the invention, the piezoelectric and dielectric application parts using the piezoelectric single crystals of excellent properties can be produced and used in the wide temperature range.

The invention claimed is:

1. A piezoelectric reinforced single crystal having a Perovskite-type crystal structure ($[A][B]O_3$) containing Zr and a composition of the following formula 8:

$[A][(MN)_{(1-x-y)}Ti_xZr_y]O_3+cP$, (formula 8)

wherein A is at least one selected from a group consisting of Pb, Sr, Ba and Bi, M is at least one selected from a group consisting of Ce, Co, Fe, In, Mg, Mn, Ni, Sc, Yb and Zn, N is one selected from a group consisting of Nb, Sb, Ta and W, and x and y satisfy, by mole fraction, following relationships:

$0.05 \leq x \leq 0.58$, $0.05 \leq y \leq 0.62$; and

P is a reinforcing second phase and c satisfies, by volume fraction, the following relationship:

$$0.001\% \leq c \leq 0.20,$$

wherein said piezoelectric crystal is a reinforced single crystal.

2. The reinforced piezoelectric single crystal according to claim 1 having a composition of the following formula 9:

$$[Pb][(MN)_{(1-x-y)}Ti_xZr_y]O_3+cP \qquad \text{(formula 9)}.$$

3. The reinforced piezoelectric single crystal according to claim 1 having a composition of the following formula 10:

$$[A][((M)(Nb))_{(1-x-y)}Ti_xZr_y]O_3+cP \qquad \text{(formula 10)}.$$

4. The reinforced piezoelectric single crystal according to claim 1 having a composition of the following formula 11:

$$[Pb_{(1-a-b)}Sr_aBa_b][((Mg,Zn)_{1/3}Nb_{2/3})_{(1-x-y)}Ti_xZr_y]O_3+cP, \qquad \text{(formula 11)}$$

where a and b satisfy following relationships: by mole fraction, $0.0 \leq a \leq 0.1$, and, $0.0 \leq b \leq 0.6$.

5. The reinforced piezoelectric single crystal according to claim 1 having a composition of the following formula 12:

$$[Pb][((Mg_{(1-a)}Zn_a)_{1/3}Nb_{2/3})_{(1-x-y)}Ti_xZr_y]O_3+cP, \qquad \text{(formula 12)}$$

where x and a satisfy following relationships: by mole fraction, $0.20 \leq x \leq 0.58$, and $0.0 \leq a \leq 0.5$.

6. The reinforced piezoelectric single crystal according to claim 1 having a composition of the following formula 13:

$$[Pb][Mg_{1/3}Nb_{2/3})_{(1-x-y)}Ti_xZr_y]O_3+cP, \qquad \text{(formula 13)}$$

where x satisfies a following relationship: by mole fraction, $0.25 \leq x \leq 0.58$.

7. A reinforced piezoelectric single crystal having a Perovskite-type crystal structure ($[A][B]O_3$) containing Zr and a composition of the following formula 14:

$$[Ba_xBi_{(1-x)}][Fe_{(1-x)}Ti_{(x-y)}Zr_y]O_3+cP, \qquad \text{(formula 14)}$$

where x and y satisfy following relationships: by mole fraction, $0.65 \leq x \leq 1.00$ and $0.05 \leq y \leq 0.15$.

8. The piezoelectric single crystal according to claim 1 wherein the reinforcing second phase (P) is selected from the group consisting of metals, oxides and pores.

9. The reinforced piezoelectric single crystal according to claim 8, wherein the reinforcing second phase (P) is at least one selected from a group consisting of Au, Ag, Ir, Pt, Pd, Rh, MgO, $ZrO_2$ and pores.

10. The reinforced piezoelectric single crystal according to claim 1, wherein the reinforcing second phase (P) is uniformly distributed in form of particles or regularly distributed in a specific pattern in the piezoelectric single crystal.

11. The reinforced piezoelectric single crystal according to claim 1, wherein x and y belong to a range of 10 mol % from a composition of morphotropic phase boundary between rhombohedral phase and tetragonal phase.

12. The reinforced piezoelectric single crystal according to claim 11, wherein x and y are in a range of 5 mol % from a composition of morphotropic phase boundary (MPB) between rhombohedral phase and tetragonal phase.

13. The reinforced piezoelectric single crystal according to claim 1, having a Curie temperature of 180° C. or more and a phase transition temperature between rhombohedral phase and tetragonal phase ($T_{RT}$) of 100° C. or more.

14. The reinforced piezoelectric single crystal according to claim 1, having a longitudinal electro-mechanical coupling coefficient ($k_{33}$) of 0.85 or more.

15. The reinforced piezoelectric single crystal according to claim 1 having a coercive electric field (Ec) of 5 kv/cm or more.

16. A method of producing a piezoelectric single crystal as defined in claim 1 comprising:
(a) controlling average size of matrix grains of a polycrystal having said composition to reduce number density of abnormal grains; and
(b) heat-treating said polycrystal with the number density of abnormal grains reduced through the step (a) to grow the abnormal grains.

17. A method of producing a piezoelectric single crystal as defined in claim 1 comprising:
(a) controlling average size of matrix grains of a polycrystal having said composition to reduce number density of abnormal grains; and
(b) heat-treating said polycrystal with the number density of abnormal grains reduced through the step (a) to grow the abnormal grains.

18. A method of producing a piezoelectric single crystal as defined in claim 1 comprising heat-treating a polycrystal having said composition under conditions that average size of matrix grains of the polycrystal is controlled so as to reduce number density of abnormal grains.

19. A method of producing a piezoelectric single crystal as defined in claim 1 comprising heat-treating a polycrystal having said composition under conditions that average size of matrix grains of the polycrystal is controlled so as to reduce number density of abnormal grains.

20. The method according to claim 16, wherein only the reduced number of abnormal grains generated under the state that the number density of abnormal grains of the polycrystal is decreased are grown continuously to produce a single crystal.

21. The method according to claim 17, wherein only the reduced number of abnormal grains generated under the state that the number density of abnormal grains of the polycrystal is decreased are grown continuously to produce a single crystal.

22. The method according to claim 18, wherein only the reduced number of abnormal grains generated under the state that the number density of abnormal grains of the polycrystal is decreased are grown continuously to produce a single crystal.

23. The method according to claim 19, wherein only the reduced number of abnormal grains generated under the state that the number density of abnormal grains of the polycrystal is decreased are grown continuously to produce a single crystal.

24. The method according to claim 16, further comprising attaching a single crystal seed to the polycrystal before the heat-treatment of the polycrystal so that the single crystal seed continuously grows into the polycrystal during the heat-treatment.

25. The method according to claim 17, further comprising attaching a single crystal seed to the polycrystal before the heat-treatment of the polycrystal so that the single crystal seed continuously grows into the polycrystal during the heat-treatment.

26. The method according to claim 18, further comprising attaching a single crystal seed to the polycrystal before the heat-treatment of the polycrystal so that the single crystal seed continuously grows into the polycrystal during the heat-treatment.

27. The method according to claim 19, further comprising attaching a single crystal seed to the polycrystal before the heat-treatment of the polycrystal so that the single crystal seed continuously grows into the polycrystal during the heat-treatment.

28. The method according to claim 16, wherein the average size of the matrix grains of the polycrystal (R) is controlled according to a following relationship:

$$0.5\,Rc \leqq R \leqq 2\,Rc,$$

where R is the average size of the matrix grains of the polycrystal, and Rc is a critical size of the matrix grains at which an abnormal grain growth starts to occur where the number density of abnormal grains becomes zero.

29. The method according to claim 17, wherein the average size of the matrix grains of the polycrystal (R) is controlled according to a following relationship:

$$0.5\,Rc \leqq R \leqq 2\,Rc,$$

where R is the average size of the matrix grains of the polycrystal, and Rc is a critical size of the matrix grains at which an abnormal grain growth starts to occur where the number density of abnormal grains becomes zero.

30. The method according to claim 18, wherein the average size of the matrix grains of the polycrystal (R) is controlled according to a following relationship:

$$0.5\,Rc \leqq R \leqq 2\,Rc,$$

where R is the average size of the matrix grains of the polycrystal, and Rc is a critical size of the matrix grains at which an abnormal grain growth starts to occur where the number density of abnormal grains becomes zero.

31. The method according to claim 19, wherein the average size of the matrix grains of the polycrystal (R) is controlled according to a following relationship:

$$0.5\,Rc \leqq R \leqq 2\,Rc,$$

where R is the average size of the matrix grains of the polycrystal, and Rc is a critical size of the matrix grains at which an abnormal grain growth starts to occur where the number density of abnormal grains becomes zero.

32. Piezoelectric application parts using a piezoelectric body comprising a reinforced piezoelectric single crystal as defined in claim 1.

33. The piezoelectric application parts according to claim 32, wherein the piezoelectric application part is a ultrasonic transducer using the piezoelectric body comprising Perovskite piezoelectric single crystals.

34. The piezoelectric application part according to claim 32, wherein the piezoelectric application part is a piezoelectric actuator using the piezoelectric body comprising Perovskite piezoelectric single crystals.

35. The piezoelectric application part according to claim 32, wherein the piezoelectric application part is a piezoelectric sensor using the piezoelectric body comprising Perovskite piezoelectric single crystals.

36. Dielectric application parts using a dielectric body comprising a reinforced piezoelectric single crystal as defined in claim 1.

\* \* \* \* \*